United States Patent [19]
Matsumi et al.

[11] Patent Number: 6,038,094
[45] Date of Patent: *Mar. 14, 2000

[54] DIGITAL DATA RECORDING DEVICE HAVING A ROTARY CYLINDER

[75] Inventors: Chiyoko Matsumi, Suita; Ichiro Arimura, Kyoto; Akira Iketani, Higashiosaka; Masazumi Yamada, Moriguchi; Tatsuro Juri, Osaka; Yukio Kurano, Higashiosaka; Yoshinori Kitamura, Takasuki; Chojuro Yamamitsu, Kawanishi, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/522,679

[22] Filed: Sep. 1, 1995

Related U.S. Application Data

[62] Division of application No. 08/893,612, Jul. 10, 1997, which is a continuation of application No. 08/323,140, Oct. 14, 1994, abandoned.

[30] Foreign Application Priority Data

Oct. 15, 1993  [JP]  Japan .................................. 5-282013
Nov. 12, 1993  [JP]  Japan .................................. 5-283230
Nov. 15, 1993  [JP]  Japan .................................. 5-284825
Nov. 18, 1993  [JP]  Japan .................................. 5-289014

[51] Int. Cl.[7] .................................................. G11B 21/04
[52] U.S. Cl. ............................ 360/70; 360/8; 360/73.05; 360/74.4
[58] Field of Search .................................. 360/64, 8, 32, 360/70, 73.05, 74.4; 358/335; 386/46, 112, 109, 131, 124

[56] References Cited

U.S. PATENT DOCUMENTS 4,862,292  8/1989  Enari et al. ................................. 360/8
4,905,104  2/1990  Okamoto et al. .
4,937,686  6/1990  Arai et al. ................................. 360/32
4,942,487  7/1990  Noguchi et al. .

(List continued on next page.)

FOREIGN PATENT DOCUMENTS 0 144 719  6/1985  European Pat. Off. .
0 327 289  8/1989  European Pat. Off. .
0 337 650  10/1989  European Pat. Off. .
0 465 110  1/1992  European Pat. Off. .

(List continued on next page.)

OTHER PUBLICATIONS

C. Yamamitsu et al., "An Experimental Study on a Home–Use Digital VTR", *International Conference on Consumer Electronics*, (ICCE) Digest of Technical Papers WPM8.6, pp. 122–123, (Jun. 6–9, 1989).
European Search Report dated Feb. 26, 1997.

*Primary Examiner*—Alan Faber
*Attorney, Agent, or Firm*—Ratner & Prestia

[57] ABSTRACT

A plurality of digital signals having total data rates of n bit/s or less are input to a digital recording device recording digital signals having a data rate of n bit/s. The digital signals are subjected to format-conversion for the digital recording device to be recorded therein. Furthermore, signals having a data rate of $n/i_1$ bit/s or less are subjected to format-conversion to be recorded $i_1$ times in the digital recording device. In the case where the data rate of the digital signals to be input is n/j bit/s, the digital signals are subjected to format-conversion so that the amount of data capable of being recorded per unit time is decreased by i/j; thus, the digital signals are recorded for a long period of time under the condition that the data recording time is prolonged j times. Furthermore, when input data to be recorded on a magnetic tape at a normal data rate by using a magnetic head mounted on a rotary cylinder is recorded, the recording device of the present invention makes it possible to select a plurality of types of track angles generated by the rotation number of the cylinder, the tape traveling speed, and the like.

4 Claims, 21 Drawing Sheets

U.S. PATENT DOCUMENTS

| | | | |
|---|---|---|---|
| 5,045,954 | 9/1991 | Oishi et al. | 360/8 |
| 5,063,453 | 11/1991 | Yoshimura et al. | |
| 5,065,259 | 11/1991 | Kubota et al. | 360/8 X |
| 5,235,471 | 8/1993 | Fell et al. | 360/8 |
| 5,291,346 | 3/1994 | Baekgaard | 360/60 |
| 5,337,199 | 8/1994 | Arai et al. | 360/10.1 X |
| 5,396,374 | 3/1995 | Kubota et al. | 360/27 |
| 5,404,248 | 4/1995 | Shimoda et al. | 360/53 X |
| 5,434,716 | 7/1995 | Sugiyama et al. | 360/32 |
| 5,465,180 | 11/1995 | Amada et al. | |
| 5,495,369 | 2/1996 | Rijckaert et al. | 360/64 X |
| 5,519,547 | 5/1996 | Yamasaki et al. | |
| 5,541,739 | 7/1996 | Tanaka . | |

FOREIGN PATENT DOCUMENTS

| | | | |
|---|---|---|---|
| 0 465 255 | 1/1992 | European Pat. Off. | |
| 0 625 850 | 11/1994 | European Pat. Off. | |
| 37 22 577 | 1/1988 | Germany . | |
| 38 08 198 | 9/1988 | Germany . | |
| 38 19 393 | 12/1988 | Germany . | |
| 38 40 290 | 5/1990 | Germany . | |
| 61-139906 | 6/1986 | Japan . | |
| 62-124650 | 6/1987 | Japan . | |
| 1-126084 | 5/1989 | Japan . | |
| 1-258255 | 10/1989 | Japan . | |
| 2-79263 | 3/1990 | Japan . | |
| 2-278571 | 11/1990 | Japan . | |
| 3-156773 | 7/1991 | Japan | 360/8 |
| 4-195862 | 7/1992 | Japan . | |
| 4-243045 | 8/1992 | Japan . | |
| 4-315398 | 11/1992 | Japan . | |
| 5-41035 | 2/1993 | Japan . | |
| 5-73864 | 3/1993 | Japan . | |
| 5-282801 | 10/1993 | Japan | 360/8 |
| 2 155 685 | 9/1985 | United Kingdom . | |
| 2251972 | 7/1992 | United Kingdom | 360/8 |

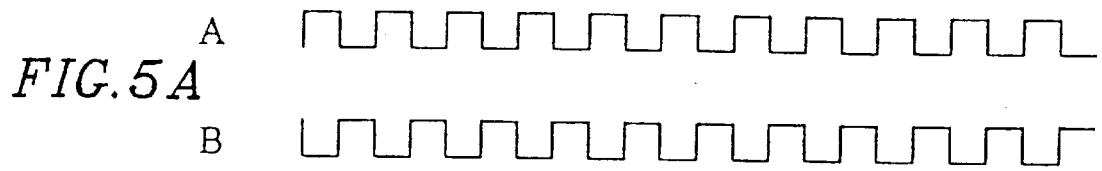
FIG.5A
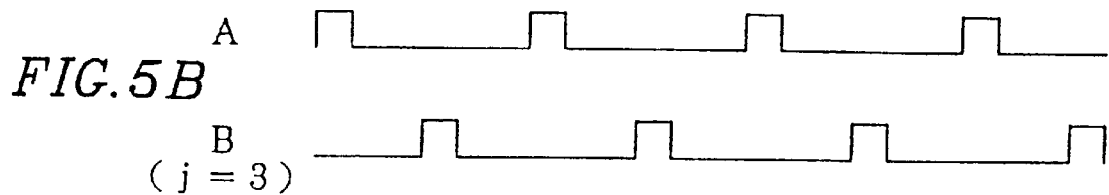
FIG.5B (j = 3)
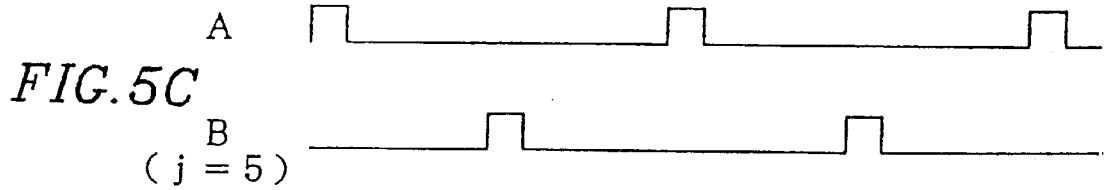
FIG.5C (j = 5)
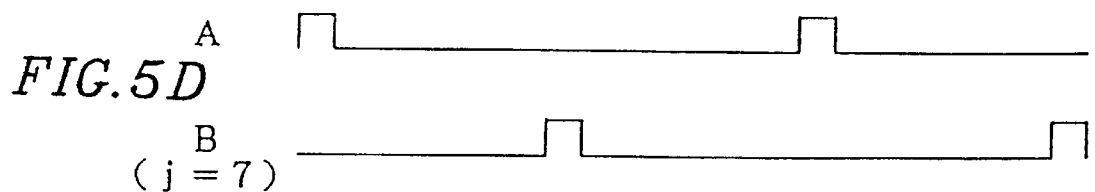
FIG.5D (j = 7)

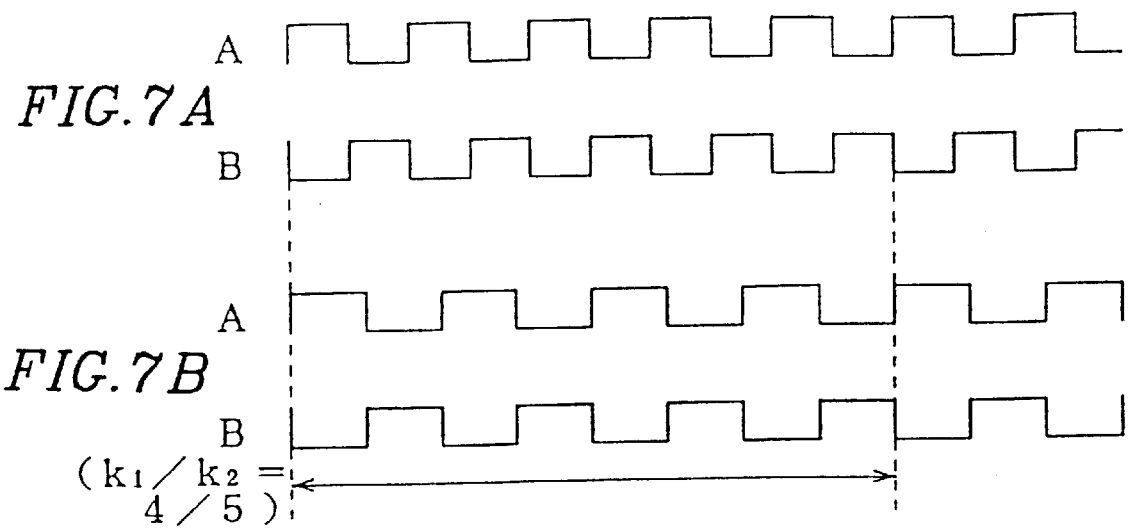

Head A with azimuth angle +

Head B with azimuth angle −

FIG. 24A  Recording head 234a
Recording head 234b

FIG. 24B  Recording head 234a
Recording head 234b

FIG. 24C  Recording head 234a
Recording head 234b

FIG. 24D  Recording head 234a
Recording head 234b

DIGITAL DATA RECORDING DEVICE HAVING A ROTARY CYLINDER

This application is a division of application Ser. No. 08/893,612, filed Jul. 10, 1997, which is a continuation of Ser. No. 08/323,140, filed Oct. 14, 1994, abandoned.

BACKGROUND OF THE INVENTION

1. Field of the Invention

The present invention relates to a device for recording and/or reproducing digital data having a plurality of kinds of rates, and a method for reproducing the same.

2. Description of the Related Art

In recent years, various kinds of digital video cassette recorders (hereinafter, referred to as DVCRs) for recording video signals such as TV signals in digital form have been developed. However, since video signals contain a great amount of information, in the case where the video signals are recorded in digital fore in a storage medium such as a tape, a long recording time is required In view of such a problem, a method for recording video signals, which are subjected to high efficiency coding, in digital form has been proposed, for example in the International Conference on Consumer Electronics (ICCE) Jun. 6–9, 1989, Digest of Technical Papers WPM8.6 "AN EXPERIMENTAL STUDY ON A HOME-USE DIGITAL VTR".

In the past, DVCRs record input video signals in synchronization with a field frequency thereof. More specifically, a magnetic head mounted in a rotary cylinder rotating in synchronization with the field frequency records video signals in tracks each having a track angle predetermined in accordance with set standards.

DVCRs use a rotary cylinder for the purpose of enhancing a recording density, and record data in tracks so as to be disposed on a magnetic tape in the diagonal direction of a magnetic tape traveling direction. For example, when a magnetic tape is wrapped around a rotary cylinder provided with two magnetic heads by about 180 degrees and the rotary cylinder rotates at a speed of 9000 rpm (rotation per minute), 18000 tracks are recorded on the magnetic tape per minute.

In general, DVCRs reproduce data in the same state as in the recorded state, except for special reproduction such as scene search, still, and slow reproductions. If data is reproduced in the state different from the recorded state, normal reproduction cannot be obtained. Thus, in the case of producing DVCRs, mechanical design specifications such as a track angle and a tape traveling speed should be strictly observed.

Since there are various kinds of high efficiency coding, the data rate after being subjected to high efficiency coding takes various values. Particularly in pre-recorded soft tapes, etc., the data rate is required to be decreased by high efficiency coding for the purpose of reducing tape cost.

In recent years, studies to supply digital video signals at a very low data rate in video services utilizing a digital TV broadcasting, a CATV, a telephone, etc. have been made. For example, the data rate of DVCRs for broadcasting is very high, i.e., 270 Mbit/s; however, a method for transmitting data after decreasing the data rate to 3 to 12 Mbit/s by filtering, high efficiency coding, etc. and a method for recording data after decreasing the data rate to 25 Mbit/s have been put into practical use. Furthermore, regarding TV signals, in addition to the NTSC system and the PAL system, 1125 line-60 field system and 1250 line-50 field system have been put into practical use.

In the case where a plurality of data rates are obtained depending upon TV signal systems or high efficiency coding methods after coding, a recording method and a reproducing method suitable for each data rate are required.

In general, the recording density and track pitch of the magnetic tape are respectively kept at nearly predetermined levels. Thus, the number of tracks and the tape traveling speed per predetermined period of time are increased in proportion to the data rate. When data is recorded at a data rate different from a normal recording data rate, a signal processing circuit and a device having a completely different cylinder construction are required. It is desired that data in one tape is copied to another tape for a short period of time. In particular, when a great amount of pre-recorded soft tapes, etc. are produced, it is desired to copy data at a data rate higher than normal for a short period of time so as to shorten the time for producing the tapes.

SUMMARY OF THE INVENTION

The method for recording digital data of the present invention by using a recording device recording a data stream having a predetermined data rate of n bit/s (n is a positive number) on a recording medium, comprises the steps of:

performing a data conversion step by receiving a plurality of input data streams having total data rates of n bit/s or less and converting the plurality of input data streams into a single output data stream having a data rate of n bit/s or less; and performing a data recording step by recording the single output data stream.

Alternatively, the method for recording digital data of the present invention by using a recording device recording a data stream having a predetermined data rate of n bit/s (n is a positive number) on a recording medium, comprises the steps of:

performing a data conversion step by receiving a single input data stream having a data rate of $n/i_1$ bit/s (n is a positive number, and $i_1$ is an integer of 2 or more) and converting the single input data stream into a single output data stream having a data rate of n bit/s or less; and performing a data recording step by recording the single output data stream for $i_1$ times.

In one embodiment of the present invention, the plurality of input data streams include $i_2$ data streams each having a data rate of $n/i_2$ bit/s (n is a positive number, and $i_2$ is an integer of 2 or more) or less.

In another embodiment of the present invention, the data conversion step includes the step of receiving $i_3$ input data streams each having a data rate of $n/i_3/i_4$ bit/s (n is a positive number, and $i_3$ and $i_4$ are integers of 2 or more) and converting the plurality of input data streams into the single output data stream having a data rate of $n/i_4$ bit/s, and the data recording step includes the step of recording the single output data stream for $i_4$ times.

In still another embodiment of the present invention, the data recording step includes the step of recording digital data indicating the number of the input data streams on the recording medium.

In still another embodiment of the present invention, the data recording step includes the step of recording digital data indicating the number of the input data streams on an auxiliary storage medium provided in a cassette accommodating the recording medium.

In still another embodiment of the present invention, the data recording step includes the step of recording digital data indicating the number of the input data streams and the number of repetition of recording on the recording medium.

In still another embodiment of the present invention, the data recording step includes the step of recording digital data indicating the number of the input data streams and the number of repetition of recording on an auxiliary storage medium provided in a cassette accommodating the recording medium.

Alternatively, the method for recording digital data of the present invention by using a recording device having a head mounted on a rotary cylinder, the recording device recording a data stream having a predetermined data rate of n bit/s (n is a positive number) on a traveling recording medium, comprises the steps of:

performing a data recording step by receiving an input data stream having a data rate of n/j bit/s or less (i is an integer of 2 or more), setting a traveling speed of the recording medium to be 1/j of a standard traveling speed and recording the output data stream on the recording medium by 1/j of scan times of the recording medium by the head.

In one embodiment of the present invention, the recording device includes paired heads, the paired heads are respectively provided so as to be symmetric with respect to a rotation axis of the rotary cylinder and have different azimuths, the recording device records the output data stream by helically scanning the recording medium, and the j is an odd number.

In another embodiment of the present invention, the data recording step includes the step of recording digital data indicating a value of the j on the recording medium.

In still another embodiment of the present invention, the data recording step includes the step of recording digital data indicating a value of the j on an auxiliary storage medium provided in a cassette accommodating the recording medium.

In still another embodiment of the present invention, the data recording step includes the step of recording digital data indicating a value of the j on the recording medium.

In still another embodiment of the present invention, the data recording step includes the step of recording digital data indicating a value of the j on an auxiliary storage medium provided in a cassette accommodating the recording medium.

Alternatively, the method for recording digital data of the present invention by using a recording device recording a data stream having a predetermined data rate of n bit/s (n is a positive number) on a recording medium, comprises the step of:

performing a data recording step by receiving a data stream having a data rate of $n \times (k_1/k_2)$ bit/s ($k_1$ and $k_2$ are integers of 2 or more, and $k_1 < k_2$), setting a traveling speed of the recording medium to be $k_1/k_2$ times, and recording the data stream on the recording medium.

In one embodiment of the present invention, the data recording step includes the step of recording digital data indicating a value of the $k_1/k_2$ on the recording medium.

In another embodiment of the present invention, the data recording step includes the step of recording digital data indicating a value of the $k_1/k_2$ on an auxiliary storage medium provided in a cassette accommodating the recording medium.

According to another aspect of the present invention, the digital data recording device provided with a rotary cylinder, and a head mounted on the rotary cylinder, for recording digital data on a recording medium, comprises recording means for recording a data stream having a predetermined data rate on the recording medium based on a recording format capable of selecting a plurality of track angles determined in accordance with a speed vector of the head and a speed vector of the recording medium.

In one embodiment of the present invention, the above-mentioned digital data recording device comprises first recording control means for controlling traveling of the recording medium so that the data stream is recorded on the recording medium once in every m times scans of the head when the data stream has a data rate which is 1/m (m is a natural number) of a predetermined data rate.

In another embodiment of the present invention, the above-mentioned digital data recording device comprises second recording control ceans for stopping traveling of the recording medium so as not to record the digital data on the recording medium for a predetermined period of time.

In still another embodiment of the present invention, the above-mentioned digital data recording device comprises second recording control means for stopping traveling of the recording medium so as not to record the digital data on the recording medium for a predetermined period of time.

Alternatively, the digital data recording device of the present invention for recording a data stream having a predetermined data rate of n bit/s (n is a positive number), comprises:

data compressing means for receiving an input data stream having a data rate of n bit/s or less and performing time axis compression with respect to the input data stream so that the input data stream is compressed into an output data stream having a data rate of n bit/s; and data recording means for recording the output data stream on the recording medium.

Alternatively, the digital data recording device of the present invention provided with a rotary cylinder, and a head mounted on the rotary cylinder, for recording digital data on a recording medium, comprises recording means for recording a data stream at a track pitch smaller than a track pitch at which normal-rate signals are to be recorded, in a case where the data stream is low-rate signals to be reproduced at a data rate lower than a predetermined data rate.

In one embodiment of the present invention, the recording means records digital data indicating at least one of the group consisting of a track angle during recording, a traveling speed of the recording medium, a rotation number of the rotary cylinder, and a track pitch of the recording medium.

In another embodiment of the present invention, the recording means records digital data indicating at least one of the group consisting of a track angle during recording, a traveling speed of the recording medium, a rotation number of the rotary cylinder, and a track pitch of the recording medium.

According to still another aspect of the present invention, the digital data reproducing device for reproducing digital data from a recording medium by using a head mounted on a rotary cylinder, comprises:

data reproducing means for reproducing digital data recorded on the recording medium at a data rate higher than a data rate during recording by increasing a rotation number of the rotary cylinder; and data output means for selectively outputting required data among the reproduced digital data.

Alternatively, the digital data reproducing device of the present invention for reproducing digital data from a recording medium by using a head mounted on a rotary cylinder, comprises:

data reproducing means for reproducing low-rate signals, which are to be reproduced at a data rate lower than a predetermined data rate, at a data rate higher than a data rate of the low-rate signals with the rotation number of the rotary cylinder substantially equal to the rotation number of the rotary cylinder during reproducing normal-rate signals which are to be reproduced at the predetermined data rate, in a case where the low-rate signals and the normal-rate signals are present; and data output means for selectively outputting required data among the reproduced digital data.

In one embodiment of the present invention, the data reproducing means and the data output means reproduce the low-rate signals by using a processing method utilized for slow reproduction of the normal-rate signals.

In another embodiment of the present invention, the data rate is in proportion with a traveling speed of the recording medium.

In still another embodiment of the present invention, the data rate is in proportion with a traveling speed of the recording medial.

According to still another aspect of the present invention, the digital data recording and reproducing device comprises recording means for recording a data stream having a predetermined data rate on a recording medium by using a head mounted on a rotary cylinder and reproducing means for reproducing a data stream recorded by the recording means, wherein, in a case where a data stream to be recorded is a data stream having a low data rate to be reproduced at a data rate lower than a predetermined data rate, the reproducing means reproduces the data stream at the predetermined data rate, and the recording means records the data stream reproduced by the reproducing means at the predetermined data rate.

In one embodiment of the present invention, the data rate is in proportion with a traveling speed of the recording medium.

In another embodiment of the present invention, the recording means records digital data indicating at least one of the group consisting of a track angle during recording, a traveling speed of the recording medium, a rotation number of the rotary cylinder, and a track pitch of the recording medium.

Alternatively, the digital data recording device of the present invention provided with a rotary cylinder, and a head mounted on the rotary cylinder, for recording digital data on a recording medium, comprises recording means for recording the digital data on the recording medium so that an angle of tracks formed on the recording medium traveling at a recording medium traveling speed different from a predetermined recording medium traveling speed is equal to an angle of tracks formed on the recording medium traveling at the predetermined recording medium traveling speed.

In one embodiment of the present invention, the recording means controls an angle formed by a rotation axis of the rotary cylinder and a traveling direction of the recording medium in accordance with the recording medium traveling speed.

In another embodiment of the present invention, the recording means includes head moving means for moving the head in a direction parallel with a rotation axis of the rotary cylinder.

In still another embodiment of the present invention, the recording means records data indicating the recording medium traveling speed on the recording medium.

Thus, the invention described herein makes possible the advantages of (1) providing a recording device in which long-time recording can be performed by converting a format; (2) providing a recording and reproducing device in which data having a data rate of a plurality of input data streams can be recording and reproduced; (3) providing a recording device in which the rotation number of the cylinder and the tape traveling speed during recording can be set at various kinds of values by using a recording format capable of selecting a plurality of types of track angles; (4) providing a reproducing device in which all the data can be reproduced even in the case where the recording track angles are not identical; (5) providing a recording device in which low-rate signals are subjected to a time axis compression in order to be recorded in a short period of time at a normal data rate; (6) providing a recording device in which data can be recorded with a track pitch smaller than standardized one; (7) providing a recording and reproducing device in which data is reproduced at a data rate higher than the data rate which is to be used for reproducing and the reproduced data is recorded at the higher data rate, making it possible for high-speed copying; and (8) providing a recording device in which even data having a data rate other than a standard one can be appropriately recorded.

These and other advantages of the present invention will become apparent to those skilled in the art upon reading and understanding the following detailed description with reference to the accompanying figures.

BRIEF DESCRIPTION OF THE DRAWINGS

FIGS. 5A to 5D are timing diagrams showing the operation of recording and reproducing in Example 2 according to the present invention.

FIGS. 7A and 7B are timing diagrams showing the operation of recording and reproducing in Example 3 according to the present invention.

7

Figure 15:
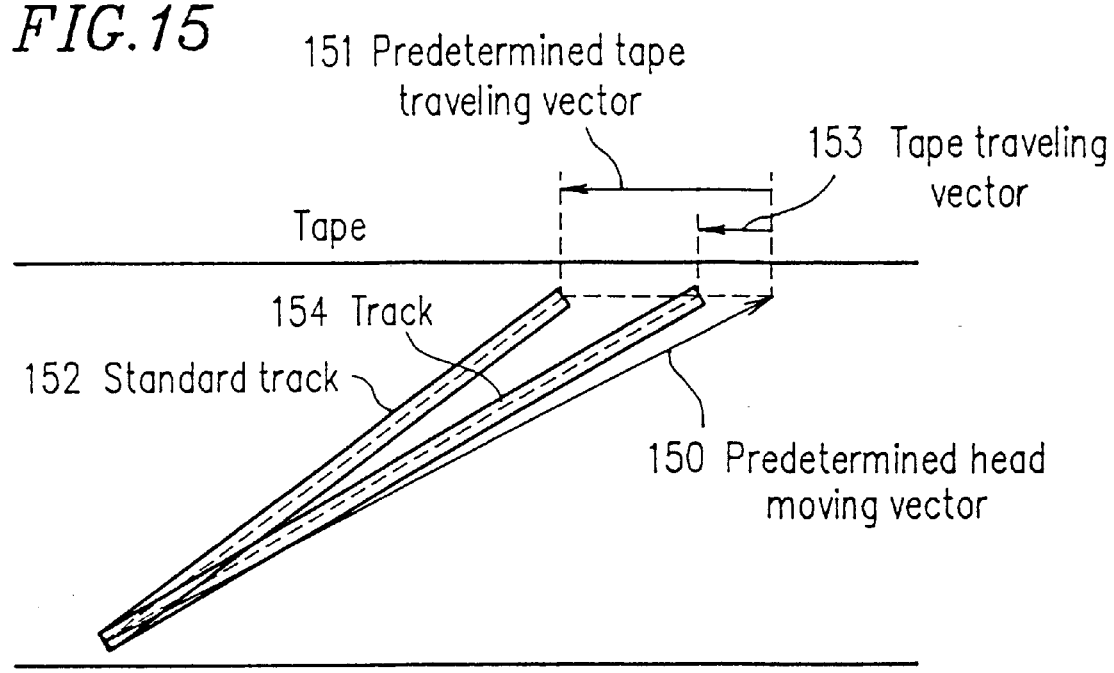

FIG. 15 is a diagram illustrating a track pattern of a recording device according to the present invention.

Figure 16:
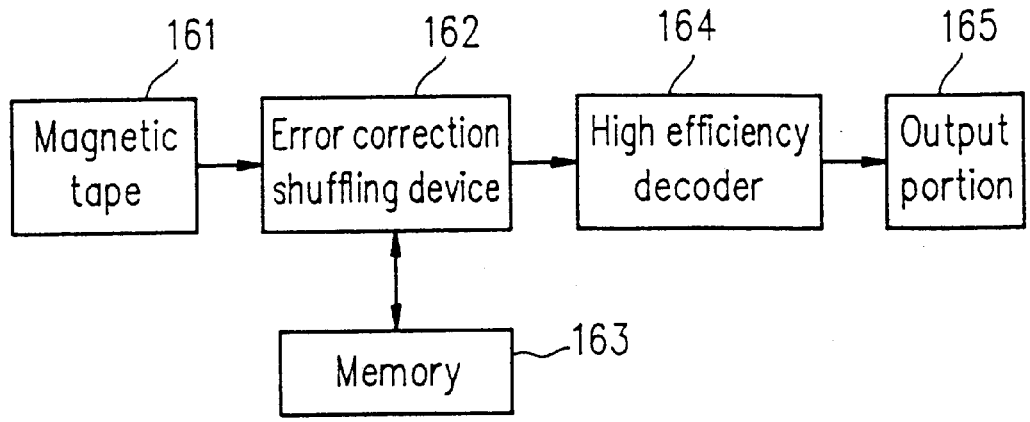

FIG. 16 is a block diagram of a reproducing device of Example 6 according to the present invention.

Figure 17:
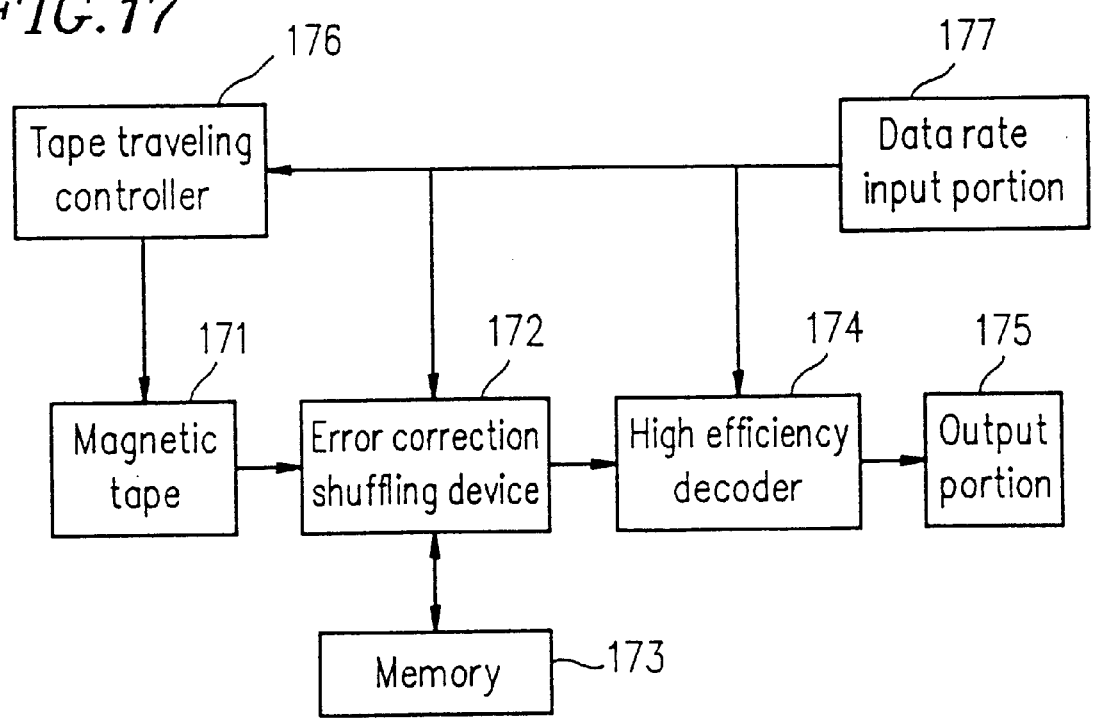

FIG. 17 is a block diagram of a reproducing device of Example 7 according to the present invention.

Figure 18:
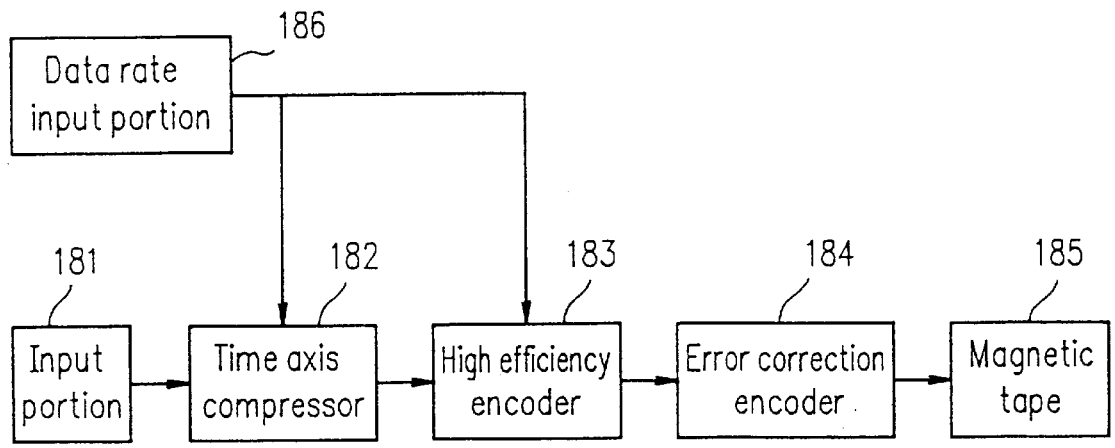

FIG. 18 is a block diagram of a recording device of Example 8 according to the present invention.

Figure 19:
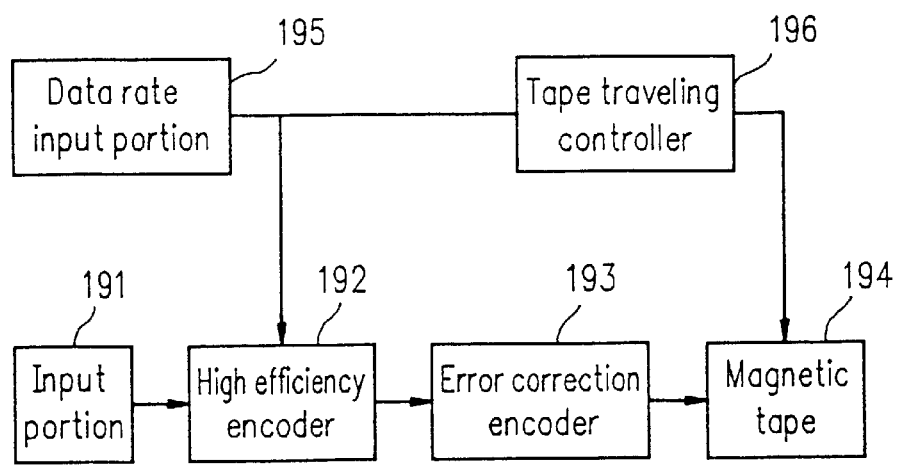

FIG. 19 is a block diagram of a recording device of Example 9 according to the present invention.

Figure 20:
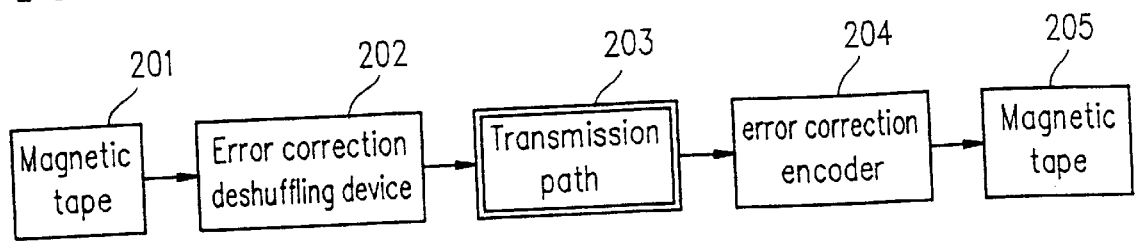

FIG. 20 is a block diagram of a recording and reproducing device of Example 10 according to the present invention.

Figure 21:
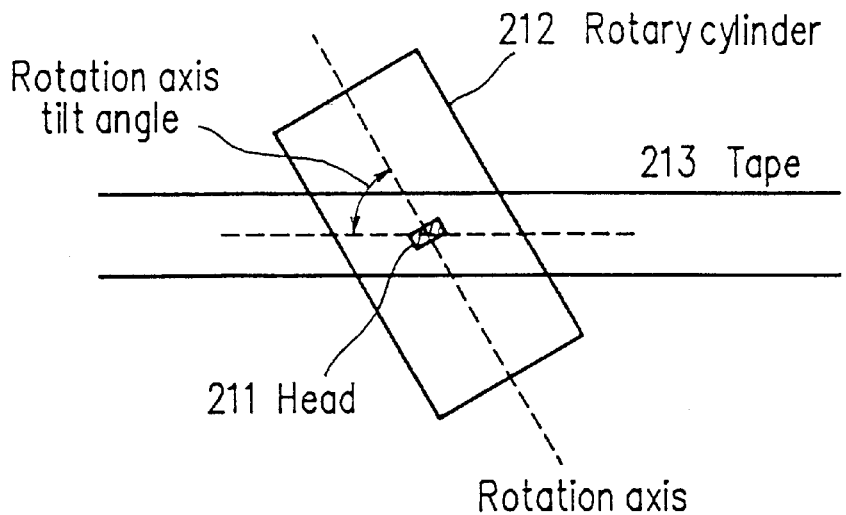

FIG. 21 is a diagram illustrating a recording device of Example 11 according to the present invention.

Figure 22:
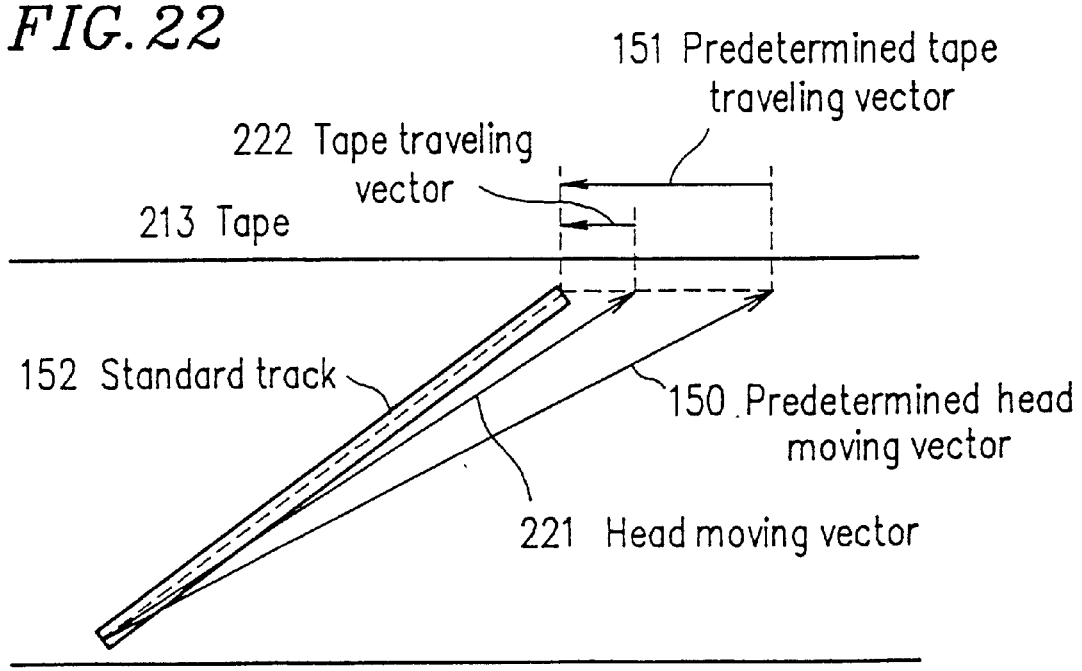

FIG. 22 is a diagram showing the relationship between the track pitch and the tape traveling speed in Example 11 according to the present invention.

Figure 23:
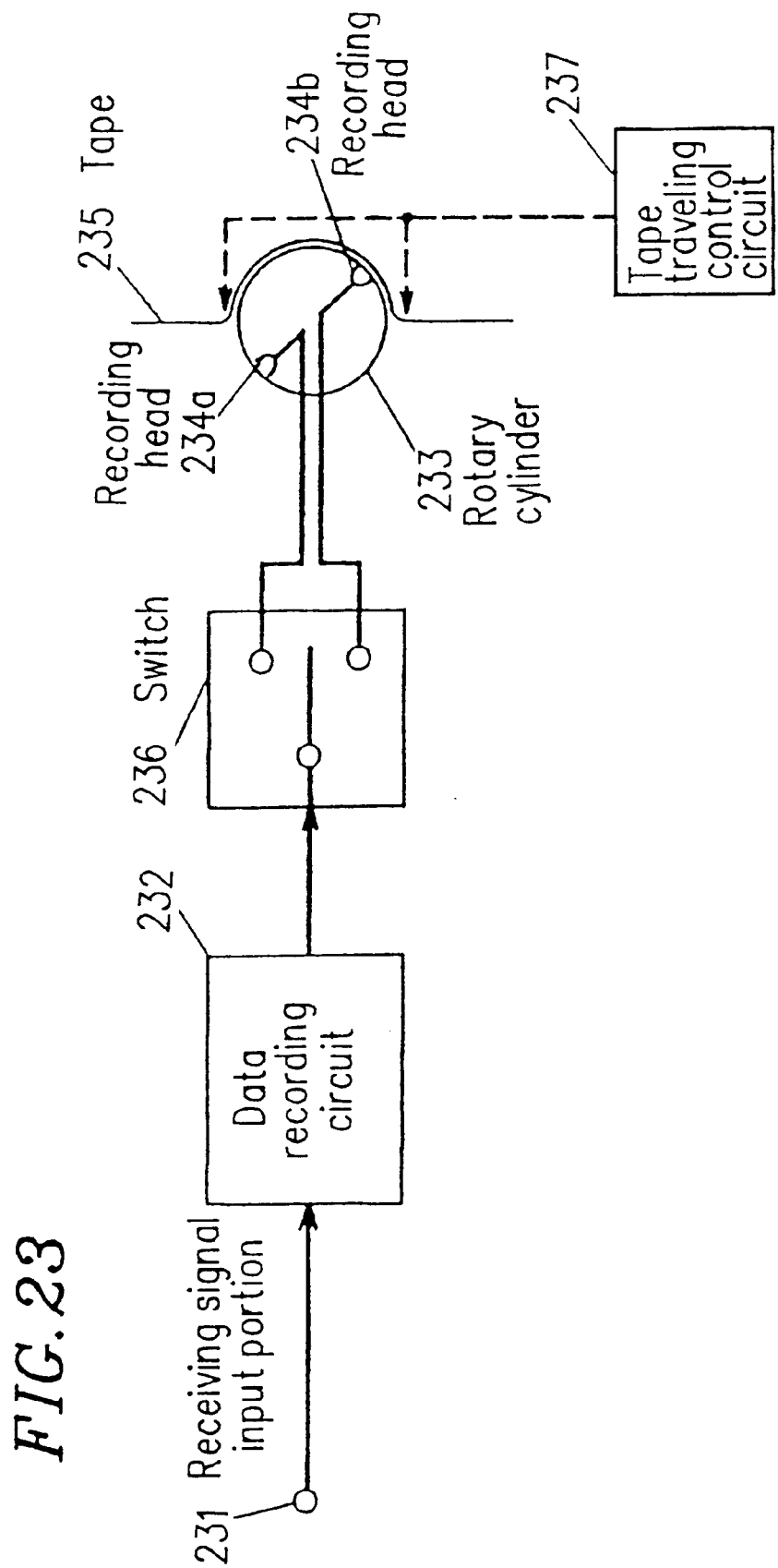

FIG. 23 is a block diagram of a recording device of Constructional Example 2 of Example 11 according to the present invention FIGS. 24A to 24D are timing diagrams showing the operation of recording in Constructional Example 2 of Example 11 according to the present invention.

Figure 25:
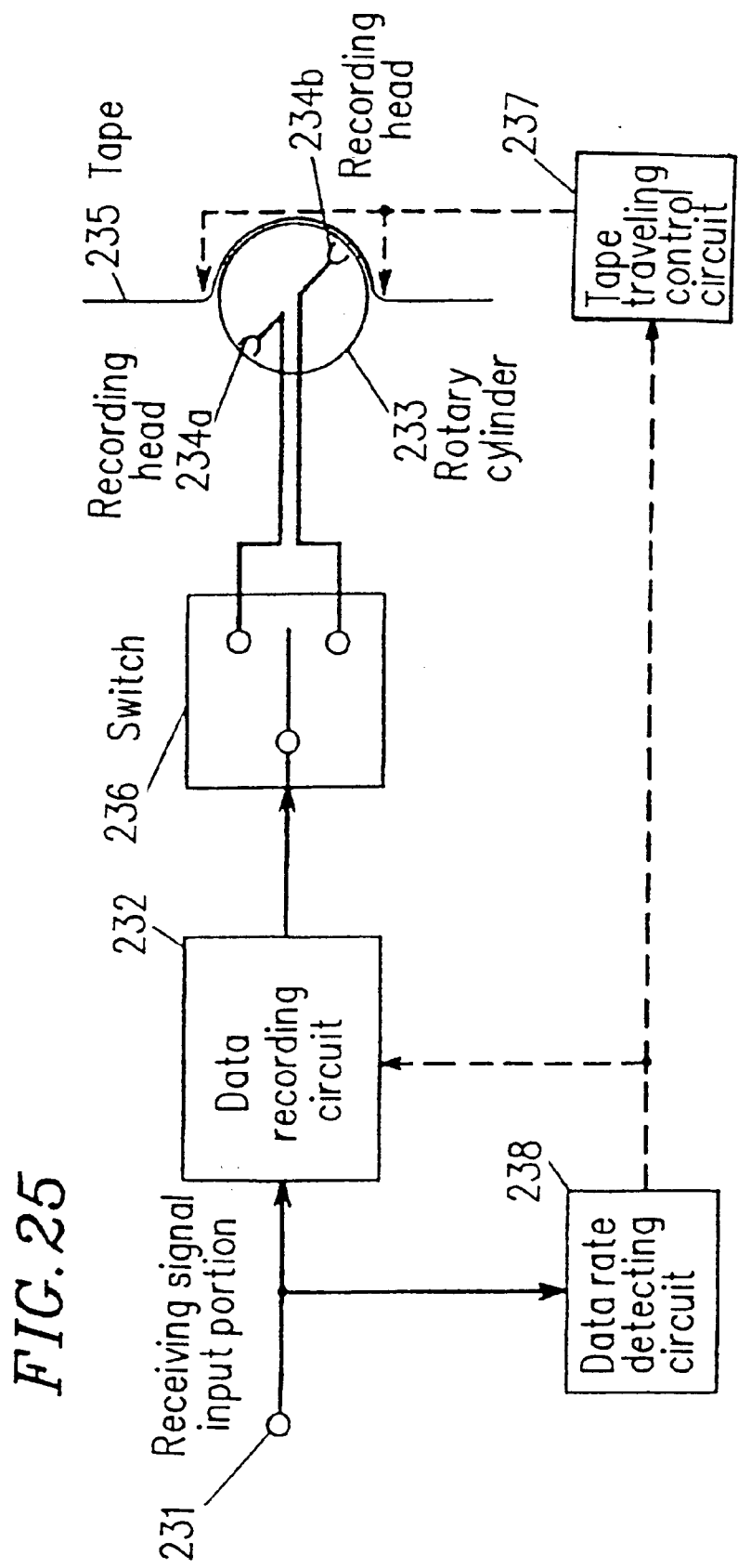

FIG. 25 is a block diagram of a recording device of Constructional Example 3 of Example 11 according to the present invention.

DESCRIPTION OF THE PREFERRED EMBODIMENTS

Hereinafter, the present invention will be described by way of illustrative examples with reference the drawings. The identical reference numerals denote the identical components.

EXAMPLE 1

Figure 1:
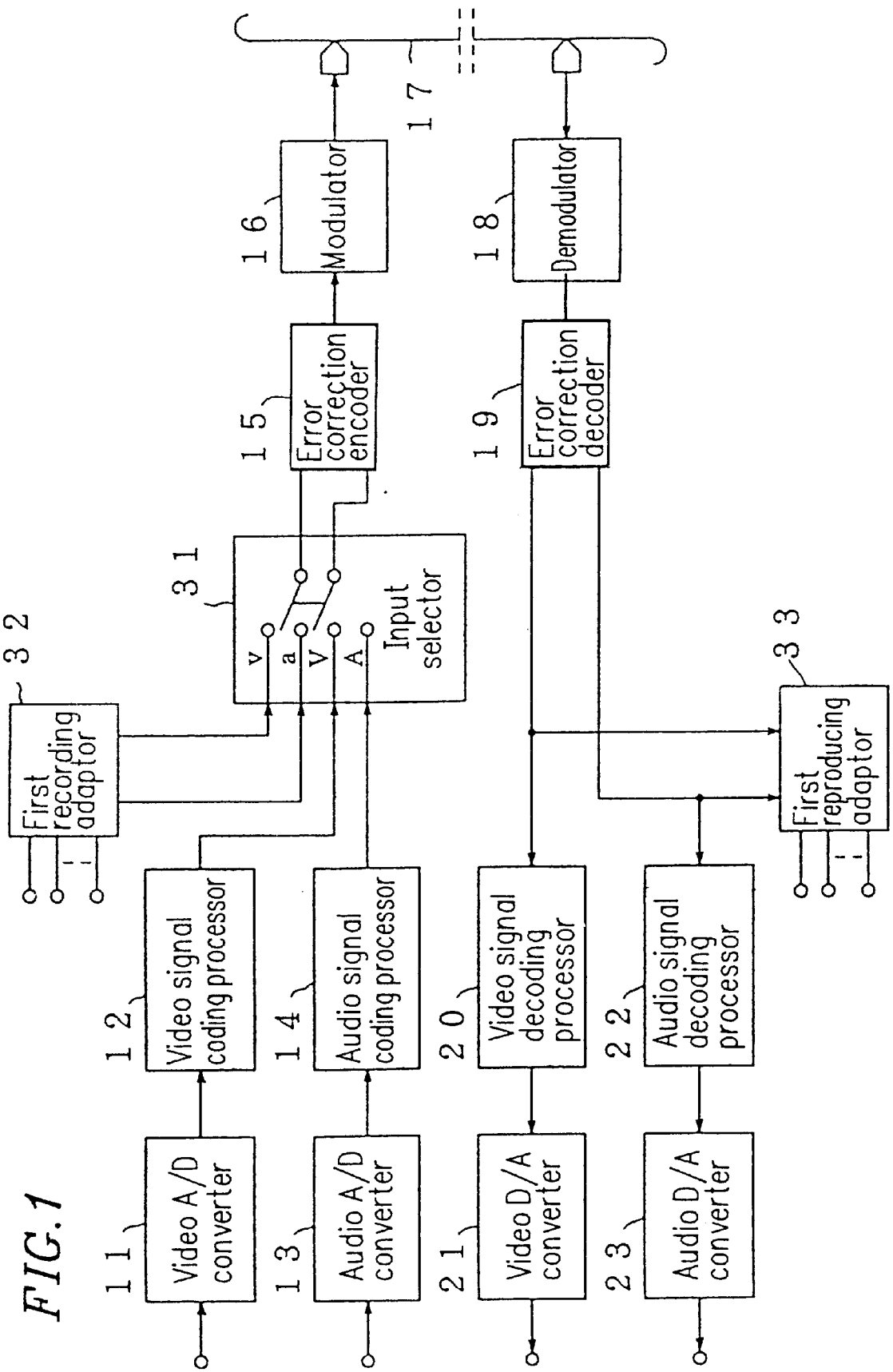
FIG. 1 is a block diagram of a recording and reproducing device of Example 1 according to the present invention.

FIG. 1 is a block diagram of a recording and reproducing device of Example 1 according to the present invention. In this figure, a video A/D converter 11, a video signal coding processor 12, an audio A/D converter 13, an audio signal coding processor 14, an error correction encoder 15, a modulator 16, a magnetic recording and reproducing system 17, a demodulator 18, an error correction decoder 19, a video signal decoding processor 20, a video D/A converter 21, an audio signal decoding processor 22, and an audio D/A converter 23 are the same as those used in conventional DVCRs; therefore, the detailed description thereof will be omitted.

In the present example, an input selector 31 is provided between the error correction encoder 15, and the video signal coding processor 12 and the audio signal coding processor 14. The input selector 31 selects between the outputs (terminals V and A) of the coding processors 12 and 14 and the outputs (terminals v and a) of a first recording adaptor 32. The outputs selected by the input selector 31 are input to the error correction encoder 15. The input selector 31 is a type of an input selector and can be switched automatically or manually. The first recording adaptor 32 receives a plurality of signals having a data rate lower than that of ordinary video and audio signals. Then, the first recording adaptor 32 converts the signals thus received into the same format as that of the outputs of the video signal coding processor 12 and the outputs of the audio signal coding processor 14, and output the converted signals to the input selector 31. In the specification, "rate" refers to data rate. Furthermore, "data rate of input data stream" refers to data rate of digital data input to the first recording adaptor 32, and "recording rate" refers to the data rate of digital data input to the modulator 16. The other construction on the recording side is the same as that of the conventional example.

On the reproducing side, the output of the error correction decoder 19 is input to the video signal decoding processor 20, the audio signal decoding processor 22, and a first reproducing adaptor 33. The first reproducing adaptor 33 reversely converts the format of the signal thus received and divides the signal into the original signals.

Figure 2A:
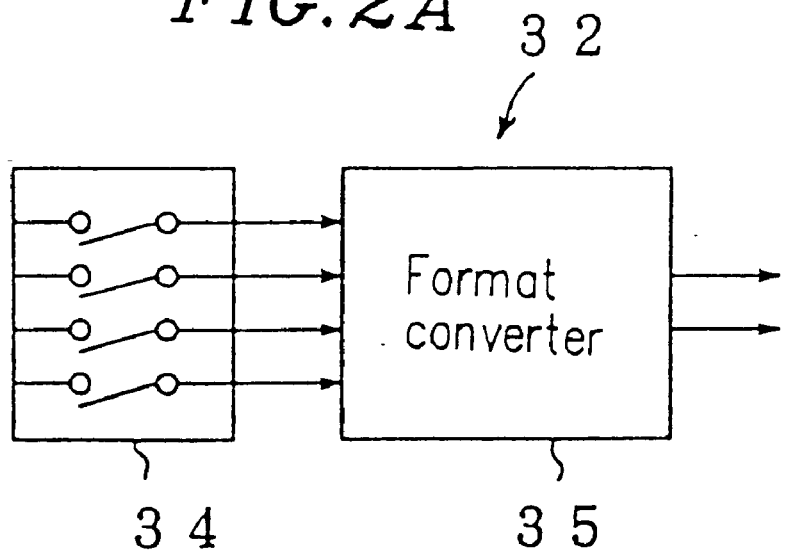
FIGS. 2A to 2E are block diagrams of a first recording adaptor used in Example 1 according to the present invention.
Figure 2B:
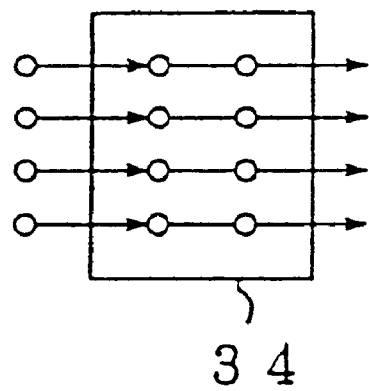
Figure 2C:
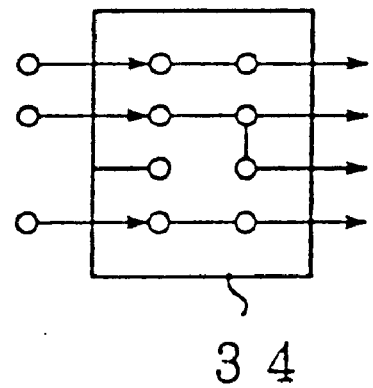
Figure 2D:
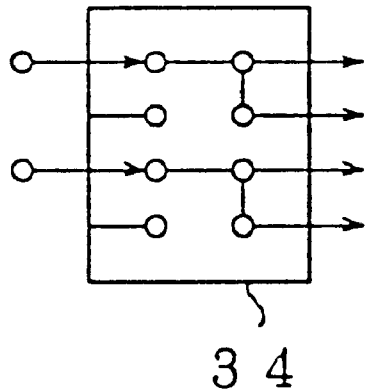
Figure 2E:
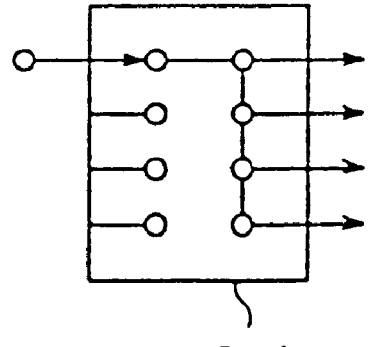

An example of the first recording adaptor 32 is shown in FIG. 2A. The first recording adaptor 32 is designed so as to receive 4 low-rate signals. Here, it is assumed that the total of the data rates of these signals does not exceed a maximum recording data rate (hereinafter, referred to as maximum data rate) of n bit/s (n is a positive number) of the recording and reproducing device. An input selector 34 switches these inputs. FIG. 2B shows the connection in the case where four signals are input; FIG. 2C shows the connection in the case where three signals are input; FIG. 2D shows the connection in the case where two signals are input; and FIG. 2E shows the connection in the case where one signal is input. These four outputs are input into a format converter 35. The format converter 35 converts the data thus received into the same format as that of the output of the video signal coding processor 12 and the output of the audio signal coding processor 14. Here, in the case where all of the low-rate signals have a data rate smaller than ¼ of the maximum data rate of the recording and reproducing device, data corresponding to the data rate difference can be added. For example, the format converter 35 performs various processings such as the addition of a fixed value, the addition of an error correction code, and the multiple-writing by selecting important information. In the case where such a variety of signals are recorded, it is required to know certain information (hereinafter, referred to as auxiliary data) such as the data rate of signals, the number of signals, and the format of signals (how the signals are formatted by the format converter 35) at the time of reproducing data. Thus, these auxiliary data are required to be recorded on the magnetic tape, and added to the video data and audio data.

Figure 3:
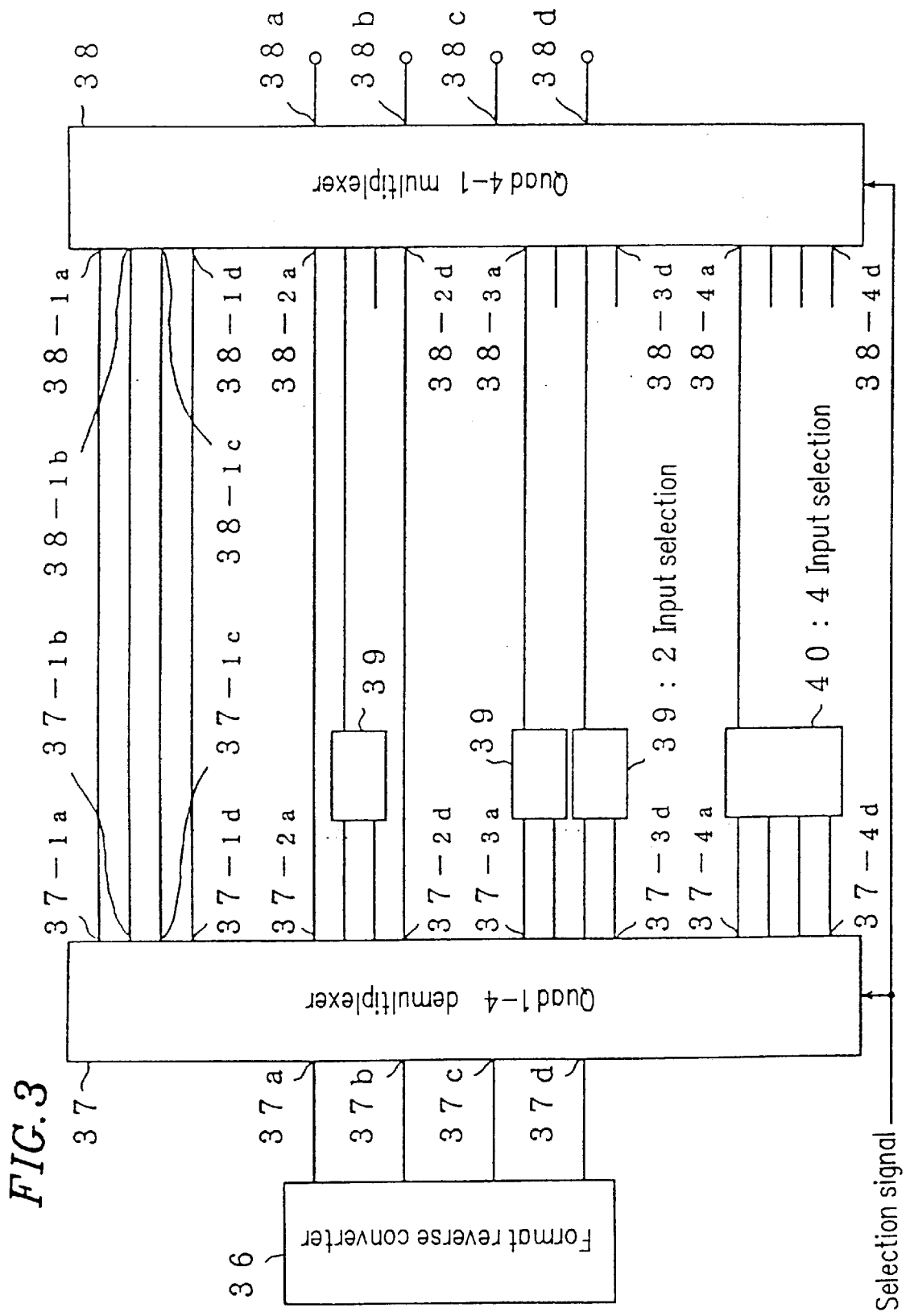
FIG. 3 is a block diagram of a first reproducing adaptor used in Example 1 according to the present invention.

FIG. 3 is a block diagram of the first reproducing adaptor 33. The output of the error correction decoder 19 is input to a format reverse-converter 36. The format reverse-converter 36 judges the signal format based on the auxiliary data and converts the output of the error correction decoder 19 into the format of low-rate signals. The output of the format reverse-converter 36 is input to input terminals 37a to 37d of a quad 1–4 demultiplexer 37 composed of four 1–4 demultiplexers. The quad 1–4 demultiplexer 37 outputs four signals respectively to output terminals is 37-1a to 37-1d, 37-2a to 37-2d, 37-3a to 37-3d, and 37-4a to 37-4d in accordance with selection signals. Four outputs 37-1a to 37-1d of the demultiplexer 37 are directly input to input terminals 38-1a to 38-1d of a quad 4–1 multiplexer 38. The output terminals 37-2a and 37-2d are directly connected to input terminals 38-2a and 38-2d of the quad 4–1 multiplexer 38, and the output terminals 37-2b and 37-2c are connected to an input terminal 38-2b of the quad 4–1 multiplexer 38 through a 2-input selector 39. An input terminal 38-2c is kept open. The output terminals 37-3a, 37-3b and 37-3c, 37-3d are respectively connected to input terminal 38-3a and 38-3c of the quad 4–1 multiplexer 38 through 2-input selectors 39. Input terminals 38-3b and 38-3d are kept open. The output terminals 37-4a to 37-4d are connected to an input terminal 38-4*a* of the quad 4–1 multiplexer 38 through a 4-input selector 40. Input terminals 38-4*b* to 38-4*d* are kept open. The quad 4–1 multiplexer 38 selects one group of input terminals among the input terminals 38-1*a* to 38-1*d*; the input terminals 38-2*a* to 38-2*d*; the input terminals 38-3*a* to 38-3*d*; and the input terminals 38-4*a* to 38-4*d*. In the case where the input terminals 38-1*a* to 38-1*d* are selected, the input terminal 38-1*a* is connected to an output terminal 38*a*, the input terminal 38-1*b* is connected to an output terminal 38*b*, the input terminal 38-1*c* is connected to an output terminal 38*c*, and the input terminal 38-1*d* is connected to an output terminal 38*d*. Signals which are multiple-recorded by the 2-input selector 39 and the 4-input selector 40 are selected corresponding to the number of output signals, whereby signals having errors are removed. Regarding a plurality of output signals, only one of them may be used, or in the case where recorded signals are video signals, picture-in-picture signals, multi-screen signals, etc., some of them may be simultaneously used.

According to the above-mentioned construction, a number of types of signals can be simultaneously recorded or signals of one kind are multiple-recorded by the same recording and reproducing device without changing the format of the tracks. If the multiple-recording is made possible, the error correction ability can be enhanced; therefore, inexpensive magnetic tape of low quality can be utilized as a recording medium. Alternatively, by decreasing the track pitch (i.e., lowering the tape traveling speed), long-time recording can be performed.

It is noted that the recording and reproducing device of the present example having another construction provide the same effects. In the present example, the number of low-rate signals is 4; however, any number of low-rate signals enables the similar recording and reproducing of data. These signals may not be the same. Furthermore, these signals may have the same or different data rates.

The recording adaptor 32 and the reproducing adaptor 33 may be provided outside of the recording and reproducing device or may be built therein. In the case where the recording adaptor 32 and the reproducing adaptor 33 are built in the recording and reproducing device, the functions thereof can be contained in the error correction encoder 15 and the error correction decoder 19. In the case where the recording adaptor 32 and the reproducing adaptor 33 are externally provided, signals having different data rates or different data formats can be recorded by changing the recording adaptor 32 and the reproducing adaptor 33.

In the recording and reproducing device performing no high efficiency coding of input signals, the input selector 31 can be provided before the video signal coding processor 12 and the audio signal coding processor 14, not right before the error correction encoder 15. This enables the use of a shuffling function of the video signal coding processor 12 and the audio signal coding processor 14.

In the present example, auxiliary data such as the data rate of signals, the number of signals, end the kinds of formats is recorded on the magnetic tape simultaneously with the recording of audio and video data. In the case where the magnetic tape is accommodated in a cassette, the cassette can be attached to a secondary storage medium (for example, an IC memory and a sheet having magnetic stripes), and the auxiliary data can be recorded in the secondary storage medium. Thus, the auxiliary data can be obtained before starting the reproducing operation. Alternatively, the auxiliary data can be input to the recording and reproducing device from outside every time data is reproduced.

EXAMPLE 2

Figure 4:
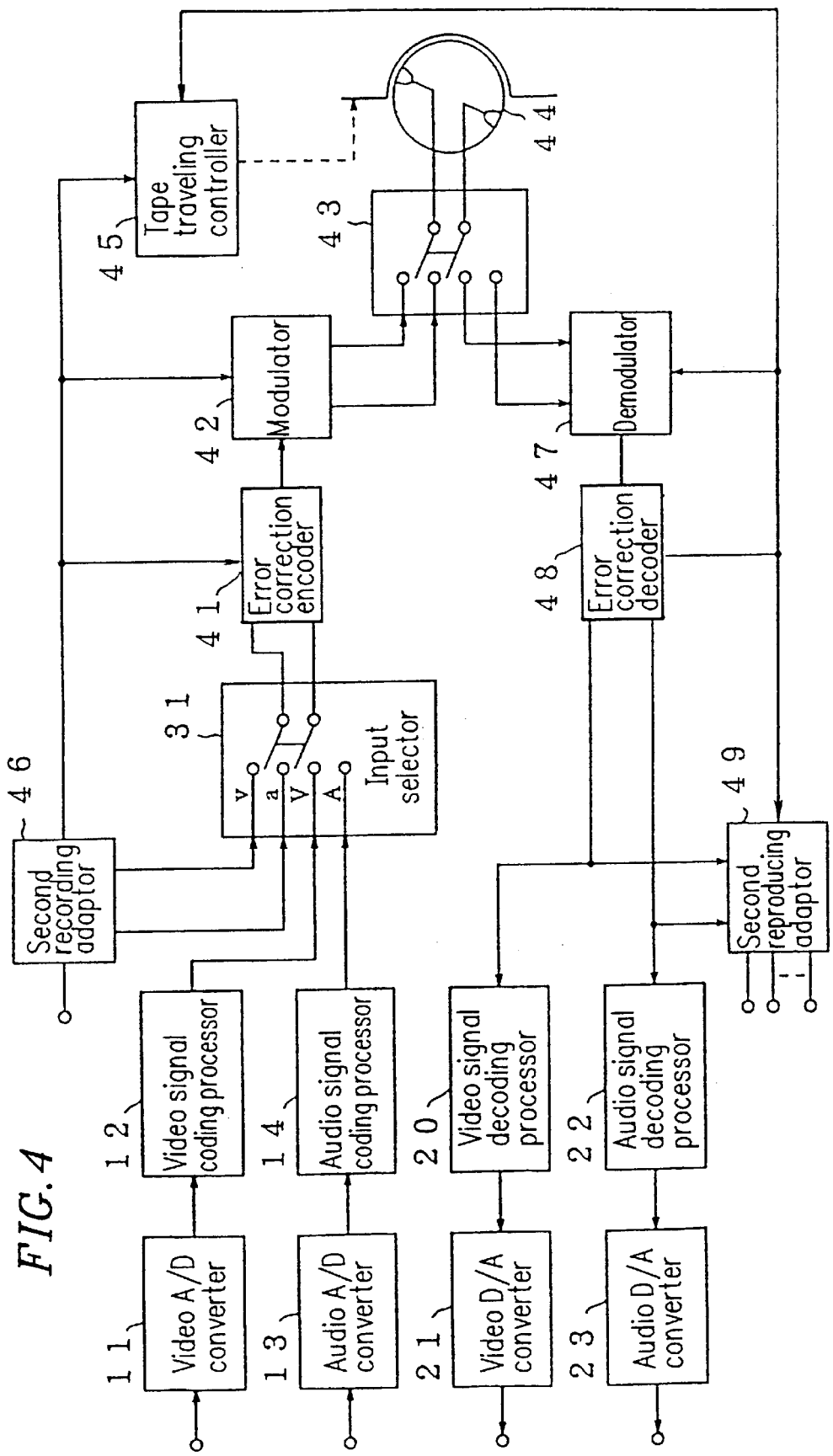
FIG. 4 is a block diagram of a recording and reproducing device of Example 2 according to the present invention.

FIG. 4 is a block diagram of a recording and reproducing device of Example 2 according to the present invention. A video A/D converter 11, a video signal coding processor 12, an audio A/D converter 13, an audio signal coding processor 14, a video signal decoding processor 20, a video D/A converter 21, an audio signal decoding processor 22, an audio D/A converter 23, and an input selector 31 are the same as those of Example 1. The output of the input selector 31 is input to a recording and reproducing selector 43 through an error correction encoder 41 and a modulator 42. The recording and reproducing selector 43 selects an input or an output at the time of recording and reproducing data. The outputs of the recording and reproducing selector 43 are connected to a rotary head of a magnetic recording and reproducing system 44. When low-rate signals are input, a tape speed of the magnetic recording and reproducing system 44 is switched by a tape traveling controller 45 in accordance with the data rate of input signals.

In the present example, the low-rate signals are input to a second recording adaptor 46. The second recording adaptor 46 converts the input signals into a format which is similar to that of the output signals of the video signal coding processor 12 and the audio signal coding processor 14 which corresponds to the recording data rate. At the same time, the data rate of the low-rate signals is output to the error correction encoder 41, the modulator 42, and the tape traveling controller 45 as tape traveling speed data. Output terminals of the recording and reproducing selector 43 are connected to a demodulator 47 and an error correction decoder 48. The outputs of the error correction decoder 48 are given to the video signal decoding processor 20, the audio signal decoding processor 22, and a second reproducing adaptor 49. The error correction decoder 48 performs error correction and decoding of the received data, and reads the tape traveling speed data simultaneously recorded on the magnetic tape. Based on the tape traveling speed data, the demodulator 47 and the second reproducing adaptor 49 are operated and the tape traveling speed of the tape traveling controller 45 is controlled.

Figure 8A:
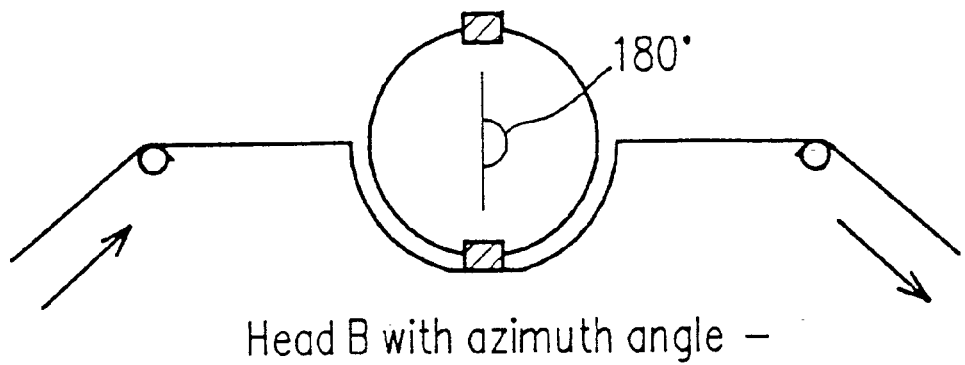
FIGS. 8A and 8B are diagrams showing a head construction of 180°-opposing double heads and the positional relationship between the magnetic head and the magnetic tape in helical recording used in the examples of the present invention, respectively.
Figure 8B:
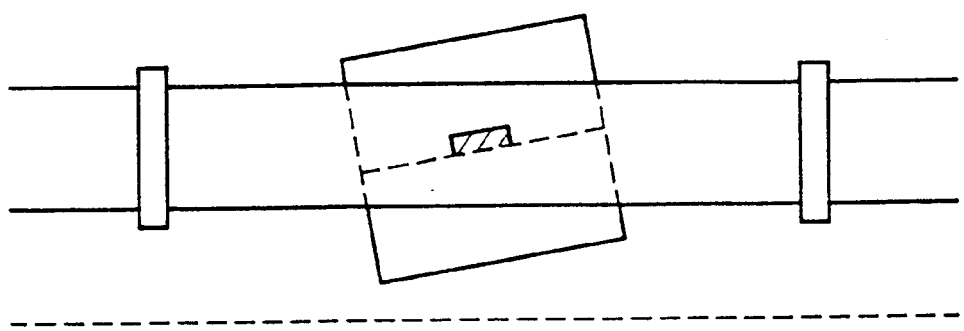

FIGS. 8A and 8B are diagrams schematically showing the rotary head of the magnetic recording and reproducing system 44. The magnetic recording and reproducing system 44 reproduces data from and records data on the magnetic tape, using the rotary head by a helical scanning method. Here, a double-azimuth head is used as the rotary head. This double-azimuth head includes two heads provided at the periphery of a cylinder so that a straight line can be obtained by connecting the positions of the two heads to a center axis of the cylinder (hereinafter, such two heads are referred to as 180°-opposing double heads). In this case, the magnetic tape is wrapped around a rotary cylinder by 180°. It is assumed that the head having one azimuth angle is the A head and the head having the other azimuth angle is B head.

Hereinafter, the operation of the present example will be described. In the case where the error correction encoder 41 is connected to terminals V and A of the input selector 31, the recording and reproducing device of the present example records and reproduces video signals and audio signals in the same manner as in the conventional example. In the case where the error correction encoder 41 is connected to terminals v and a, the second recording adaptor 46 outputs the data rate of signals transmitted at a low data rate as tape traveling speed data. When the data rate of the low-rate signals is $1/j$ or less (j is an odd number) of the maximum data rate of the recording and reproducing device, the tape traveling speed is $1/j$ of conventional tape traveling speed.

FIGS. 5A to 5D are timing diagrams in which the period for actually recording and reproducing data by each head is represented as "High" and the period for recording and reproducing no data by each head is represented as "Low". FIG. 5A is a timing diagram in the case of the conventional recording and reproducing. FIGS. 5B, 5C, and 5D are timing diagrams in the case where j is 3, 5, and 7, respectively. A recording method, in which irrespective of the fact that the magnetic head is scanning, data is recorded only once in every n times scans, is referred to as "skip" recording. The use of the 180°-opposing double heads requires the condition that j is an odd number. In order to alternately scan by using 180°-opposing double heads with a different azimuth, scanning must be performed in the following manner: A(BA)B(AB)A(BA) . . . , where A denotes a head having one azimuthal angle and B denotes a head having another azimuthal angle, and the parentheses correspond to a head performing no recording and reproducing. Since scanning without recording and reproducing is performed for an even-number of times per scan, j results in an odd number.

The error correction encoder 41, the modulator 42, the magnetic recording and reproducing system 44, the demodulator 47, and the error correction decoder 48 respectively function in the same manner as in the error correction encoder 15, the modulator 16, the magnetic recording and reproducing system 17, the demodulator 18, and the error correction decoder 19, except for the functions enabling the operation corresponding to the above-mentioned skip recording and reproducing. Furthermore, the recording and reproducing selector 43 connects the head to the modulator 42 in the case of recording data, and connects the head to the demodulator 45 in the case of reproducing data.

The input data stream at a low data rate are converted into a format which is the same as that of the outputs of the video signal coding processor 12 and the audio signal coding processor 14 and which corresponds to the maximum data rate. Thereafter, the converted signals are subjected to error correction coding and modulation. At the time of reproducing data, the data is demodulated by the demodulator 47 and subjected to error correction and decoding by the error correction-decoder 48. Thereafter, the data is reverse-converted into a format of the low-rate signals by the second reproducing adaptor 49, and thus, recorded signals are reproduced.

In the case where the data rate of the low-rate signals is smaller than 1/j (j>1) of the maximum data rate of the recording and reproducing device, the second recording adaptor 46 can add data corresponding to the data rate difference. For example, the second recording adaptor 46 performs processings such as the addition of a fixed value, the addition of error correction coding, and the multiple-waiting by selecting important information. In the case where such a variety of signals are recorded, it is required to know the auxiliary data at the time of reproducing data. Thus, the auxiliary data must be recorded on the magnetic tape. The auxiliary data is recorded on the magnetic tape after being added to video data and audio data by the format converter (not shown) in the second recording adaptor 46. At the time of reproducing data, since the tape traveling speed data is obtained by the error correction decoder 48, it is possible to reproduce data at an appropriate tape traveling speed. When the tape traveling speed is varied, track angles of tracks to be formed (an angle formed by a tape edge and each track) are slightly different. However, this does not cause any problems for obtaining the tape traveling speed data.

According to the above-mentioned construction, the format of the tracks is not changed. Thus, a long-time recording which is j times that of the low-rate signals can be performed only by changing the tape traveling speed and the recording timing, using the same recording and reproducing device. Furthermore, when j is $j_1 \times j_2$, $j_2$ times long-time recording can be performed by conducting $j_1$ times multiple-recording. When multiple-recording can be performed, error correction ability is enhanced. Consequently, an inexpensive magnetic tape of poor quality can be used. In addition, a long-time recording is made possible by decreasing the track pitch (that is, lowering the tape traveling speed). In the case where the head width is larger than the track pitch, even though multiple-recording is not performed, an inexpensive magnetic tape of poor quality can be used by increasing the track pitch (that is, multiplying the tape traveling speed by a head width/normal track pitch) so as to reduce the generation of errors.

Figure 9A:
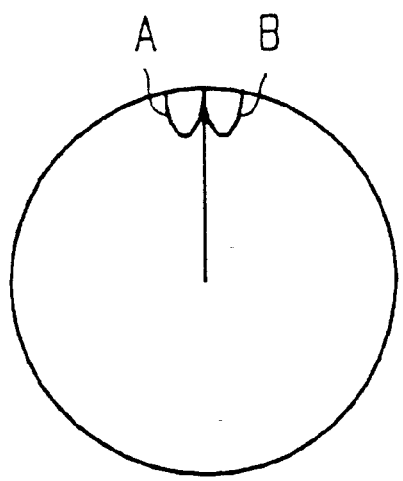
FIGS. 9A and 9B are diagrams showing other head construction of "paired" heads used in the examples of the present invention.
Figure 9B:
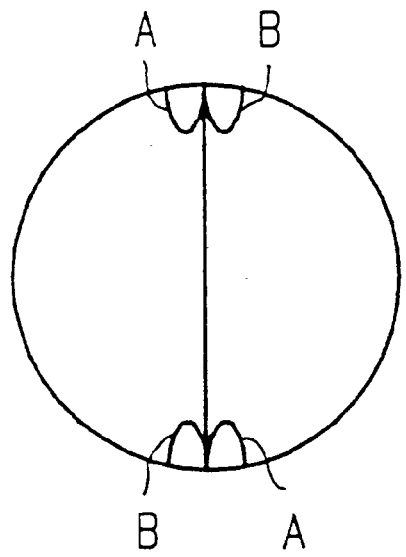

The block construction of the recording and reproducing device of the present example is merely one example. The same effects can also be obtained with any construction. In the present example, the double-azimuth 180°-opposing double heads (the magnetic tape is wrapped around the rotary cylinder by 180°) as shown in FIGS. 8A and 8B is used. This limits the value of j to odd numbers. If "paired" heads shown in FIGS. 9A and 9B are used, i.e., the head A and the head B are disposed adjacent to each other, j can be any number of 1 or more. Alternatively, in the case where data is recorded by providing a guard band instead of using the azimuth, j is any number of 1 or more irrespective of the head construction.

In the present example, the recording and reproducing timing as shown in FIGS. 5A to 5D is used. For example, in the case where a head utilizing a piezoelectric element is used, the same track can be repeatedly reproduced even at timings other than this timing, and error correction ability can be enhanced.

Furthermore, the recording adaptor 46 and the reproducing adaptor 49 can be provided outside of the recording and reproducing device or built therein. In the case where the recording adaptor 46 and the reproducing adaptor 49 are built in the recording and reproducing device, the functions thereof can be contained in the error correction encoder 41 and the error correction decoder 48. In the case where the recording adaptor 46 and the reproducing adaptor 49 are externally provided, signals having different data rates are recorded by changing the recording adaptor 46 and the reproducing adaptor 49.

In the recording and reproducing device performing no high efficiency coding of input signals, the input selector 31 can be provided before the video signal coding processor 12 and the audio signal coding processor 14, not immediately before the error correction encoder 41. This enables the use of a shuffling function of the video signal coding processor 12 and the audio signal coding processor 14.

In the present example, the tape traveling speed data is also recorded on the magnetic tape simultaneously with the recording of audio and video data. In the case where the magnetic tape is accommodated in a cassette, the cassette can be attached to a secondary storage medium (for example, an IC memory and a sheet having magnetic stripes), and the tape traveling speed data can be recorded in the secondary storage medium. Thus, the appropriate tape traveling speed data can be obtained before starting the reproducing operation. Alternatively, the appropriate tape traveling speed data can be input to the recording and reproducing device from outside every time data is reproduced.

EXAMPLE 3

Figure 6:
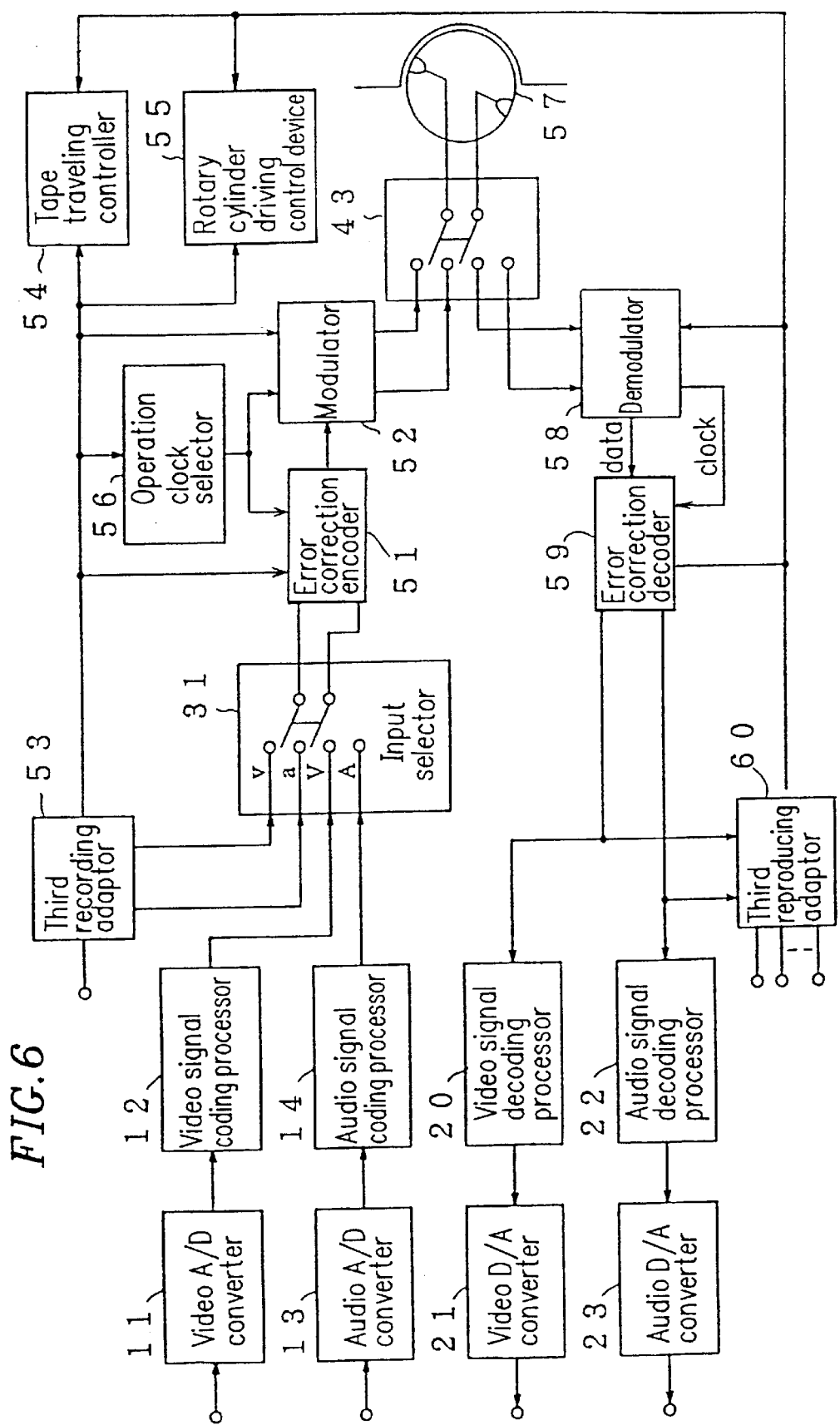
FIG. 6 is a block diagram of a recording and reproducing device of Example 3 according to the present invention.

FIG. 6 is a block diagram of a recording and reproducing device of Example 3 according to the present invention. A video A/D converter 11, a video signal coding processor 12, an audio A/D converter 13, an audio signal coding processor 14, a video signal decoding processor 20, a video D/A converter 21, an audio signal decoding processor 22, an audio D/A converter 23, an input selector 31, and a recording and reproducing selector 43 are the same as those of Example 2. The detailed description thereof will be omitted.

Output terminals of the input selector 31 are connected to an error correction encoder 51 and a modulator 52, and a modulated output of the modulator 52 is given to the recording and reproducing selector 43. In the present example, low-rate input signals are given to a third recording adaptor 53. The third recording adaptor 53 converts the given input signals into a format which is the same as that of the outputs of the video signal coding processor 12 and the audio signal coding processor 14 and which corresponds to the recording rate. The outputs of the third recording adaptor 53 are given to terminals v and a of the input selector 31. The data rate of low rate signals input to the third recording adaptor 53 is given as recording operation data, to the error correction encoder 51, the modulator 52, a tape traveling controller 54, a rotary cylinder driving control device 55, and an operation clock selector 56. The operation clock selector 56 supplies the operation clock corresponding to the recording rate at the time of recording data. The tape traveling controller 54 and the rotary cylinder driving control device 55 controls the tape traveling speed and the rotation speed of the rotary cylinder of the magnetic recording and reproducing system 57, respectively, based on recording operation data. Here, the recording operation data is one type of auxiliary data, which is data for determining the tape traveling speed and the rotation speed of the rotary cylinder of the magnetic recording and reproducing system 57. At the time of reading data, the recording and reproducing selector 43 is switched to a demodulator 58 side. The demodulator 58 demodulates the signals recorded on the magnetic tape and generates an operation clock. An error correction decoder 59 performs error correction to decode the original signals and read video data and audio data. At this time, the recording operation data recorded on the magnetic tape is read so as to be given to the demodulator 58, a third reproducing adaptor 60, the tape traveling controller 54, and the rotary cylinder driving control device 55, whereby the tape speed at the time of reproducing data is controlled. The third reproducing adaptor 60 reproduces and outputs original low-rate signals based on this recording operation data.

In the present example, the magnetic recording and reproducing system 57 has a rotary head as shown in FIGS. 8A and 8B and records data on the magnetic tape by a helical scanning method. For example, a double-azimuth 180°-opposing double heads is used as the rotary head. Here, the magnetic tape is wrapped around a cylinder by 180°. It is assumed that the head with one azimuth angle is A head and the head with the other azimuth angle is B head.

Hereinafter, the operation of the present example will be described. In the present example, video signals and audio signals are recorded and reproduced at a normal speed in the same manner as in conventional DVCRs, in the case where the error correction encoder 51 is connected to terminals V and A by the input selector 31.

In the case where the error correction encoder 51 is connected to terminals v and a, the data rates of low-rate signals are output from the third recording adaptor 53 as recording operation data. When the total of the data rates of the low-rate signals is $k_1/k_2$ or less ($k_1$, $k_2$ are integers, $k_1<k_2$) of the maximum data rate (n bit/s, where n is a positive number) of the recording and reproducing device, the data rate at which data is recorded on the magnetic tape is made $k_1/k_2$ of conventional data rate. At the same time, the rotation number of the cylinder and the tape traveling speed are made $k_1/k_2$ of the conventional rotation number and the conventional tape traveling speeds respectively.

FIGS. 7A and 7B are timing diagrams in which the period for actually recording and reproducing data by each head is represented as "High" and the period for recording and reproducing no data by each head is represented as "Low". FIG. 7A is a timing diagram in the case of the conventional recording and reproducing. FIG. 7B is a timing diagram in the case of $k_1/k_2=4/5$. Eight tracks are formed according to the timing diagram of FIG. 7B within a period of time during which 10 tracks are formed according to the timing diagram of FIG. 7A. The period of time required for forming one track shown in the timing diagram of FIG. 7B is 5/4 times that shown in the timing diagram of FIG. 7A; however, the recording rate shown in the timing diagram of FIG. 7B is 4/5 times that shown in the timing diagram of FIG. 7A. Therefore, the amount of data recorded at 4/5 of the normal rate in one track is the same as that recorded at normal rates. Consequently, input data stream having a data rate of 4/5 of normal data rate can be recorded for 5/4 times of maximum recording time. Thus, a long-time recording of a low-rate signal is possible.

The error correction encoder 51, the modulator 52, the magnetic recording and reproducing system 57, the demodulator 58, and the error correction decoder 59 are provided with additional functions to operate for recording and reproducing utilizing variable rotation number and variable tape traveling speed. Except for these functions, the error correction encoder 51, the modulator 52, the magnetic recording and reproducing system 57, the demodulator 58, and the error correction decoder 59 are respectively the same as the error correction encoder 15, the modulator 16, the magnetic recording and reproducing system 17, the demodulator 18, and the error correction decoder 19. The operation clock selector 56 supplies the operation clock corresponding to the recording rate to the error correction encoder 51 and the modulator 52 at the time of recording data. At the time of reproducing data, the operation clock demodulated from signal reproduced from the magnetic tape is supplied to the demodulator 58 and the error correction decoder 59.

The third recording adaptor 53 converts the low-rate signals into a format which is the same as that of the outputs of the video signal coding processor 12 and the audio signal coding processor 14 and which corresponds to the recording rate. After being subjected to the error correction coding and modulation, the signals are recorded. At the time of reproducing data, after being subjected to demodulation and error correction decoding, the data is reverse-converted into low-rate signals by the third reproducing adaptor 60, whereby the record ed signals can be obtained.

In the case where the data rate of the low-rate signals is smaller than $k_1/k_2$ of the maximum data rate of the recording and reproducing device, the third recording adaptor 53 adds data corresponding to the data rate difference. For examples the third recording adaptor 53 performs processings such as the addition of a fixed value, the addition of error correction coding, and multiple-writing by selecting important information.

When the signals are recorded or reproduced by the above-mentioned method, there is a need to know the auxiliary data. For this reason, the auxiliary data should be recorded on the magnetic tape. The auxiliary data to be added to video and audio data is also output from the third recording adaptor 53. At the time of reproducing data, since the recording operation data is obtained by the error correction decoder 59, correct reproduction is made possible.

According to the above-mentioned construction, the format of tracks is not changed. Thus, longtime recording, i.e., $k_2/k_1$ times longer recording, can be performed with respect to low-rate signals merely by changing the recording operation, using the conventional recording and reproducing device. Furthermore, the generation of errors can be reduced by recording data with a wider track pitch (i.e., increasing tape the tape traveling speed), using the head with larger width. As a result, an inexpensive magnetic tape of poor quality can be utilized.

The block construction of the recording and reproducing device of the present example is merely an example.

In the present example, the double-azimuth 180°-opposing double heads as shown in FIGS. 8A and 8B is used. Head A and head B are located in such a manner that head A and head B are symmetric with respect to a rotation axis of a rotary cylinder. In this case, the magnetic tape is wrapped around a cylinder by 180°.

In the present example, the operation clock selector 56 supplies the operation clock corresponding to the recording data rate to the error correction encoder 51 and the modulator 52. Since signals corresponding to a desired recording data rate are input to the modulator 52, a signal processing such as forming blanks between data can be performed instead of changing the operation clock. In the case where the operation clock is not changed, the constructions of the error correction encoder 51 and the modulator 52 are not required to be changed.

The third recording adaptor 53 and the third reproducing adaptor 60 may be provided outside of the recording and reproducing device or may be built therein. In the case where the third recording adaptor 53 and the third reproducing adaptor 60 are built In the recording and reproducing device, the functions thereof can be contained in the error correction encoder 51 and the error correction decoder 59. In the case where the third recording adaptor 53 and the third reproducing adaptor 60 are externally provided, signals having different data rates can be recorded by changing the third recording adaptor 53 and the third reproducing adaptor 60.

In the recording and reproducing device performing no high efficiency coding of input signals, the input selector 31 can be provided before the video signal coding processor 12 and the audio signal coding processor 14, not right before the error correction encoder 51. This enables the use of a shuffling function of the video signal coding processor 12 and the audio signal coding processor 14.

In the present example, the recording operation data is also recorded on the magnetic tape simultaneously with the recording of audio and video data. In the case where the magnetic tape is accommodated in a cassette, the cassette can be attached to a secondary storage medium (for example, an IC memory and a sheet having magnetic stripes), and the recording operation data can be recorded in the secondary storage medium. Thus, the appropriate recording operation data can be obtained before starting the reproducing operation. Alternatively, the appropriate recording operation data can be input to the recording and reproducing device from outside every time data is reproduced.

EXAMPLE 4

Figure 10:
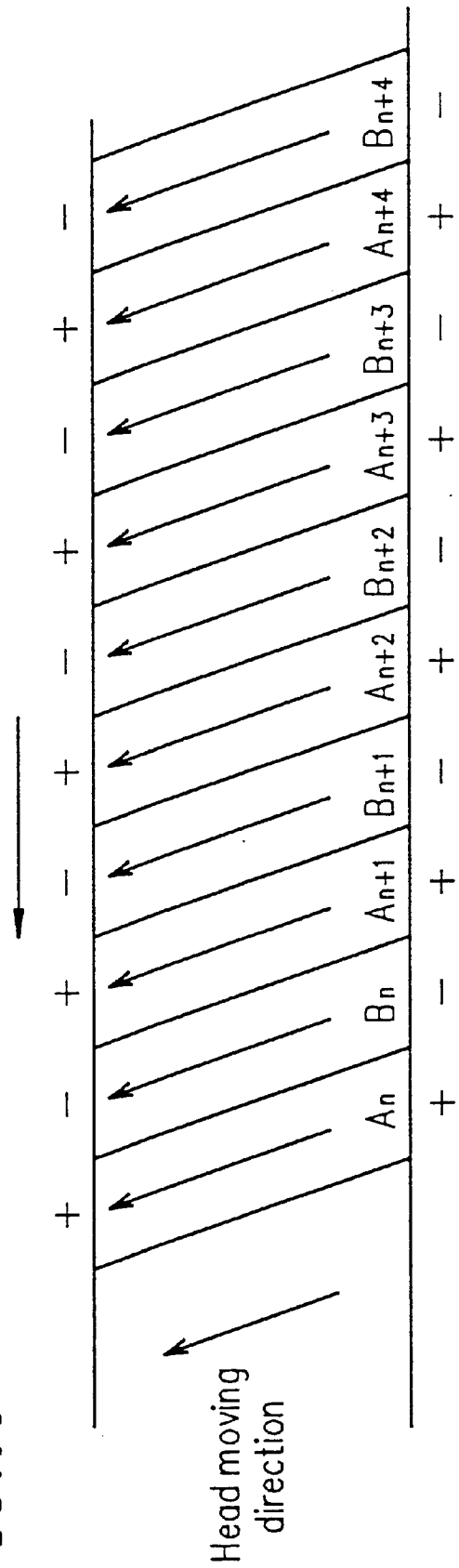
FIG. 10 shows a track pattern in helical recording at normal speed.

Hereinafter, the long-time recording of low-rate signals in a recording device of Example 4 according to the present invention will be described. In the present example, the tape traveling speed of the second and third examples is modified. The present example will be described with reference to FIG. 6. In the case where the error correction encoder 51 is connected to the terminals V and A by the input selector 31, video signals and audio signals are recorded and reproduced at a normal speed in the same manner as in conventional VCRs. When data is recorded at a normal speed, the traveling speed of a magnetic tape is set to be 18 mm/s by the tape traveling controller 54. In an auxiliary data storage region of the magnetic tape, the value of data rate 24 Mbit/s at input data stream is recorded. FIG. 10 is a diagram showing a track pattern during recording at a normal speed.

In the case where the error correction encoder 51 is connected to the terminals v and a, the data rate of low-rate signals is output as recording operation data from the third recording adaptor 53.

Hereinafter, the operation of recording and reproducing data will be described, in the case where the data rate of input video signals is 4 Mbit/s, i.e., the data rate is ⅙ of a 24 Mbit/s normal data rate.

Figure 11:
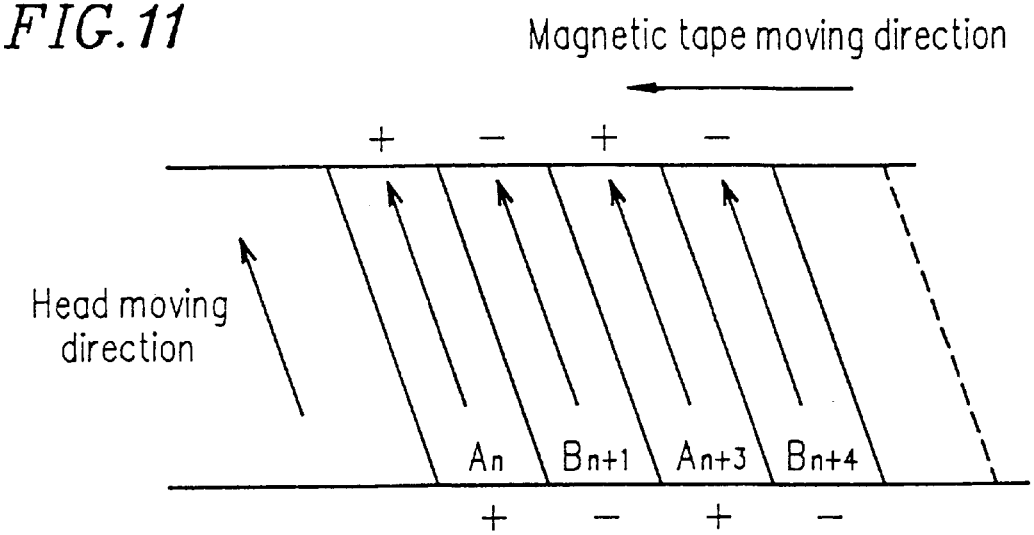
FIG. 11 shows a track pattern in helical recording in Example 4 according to the present invention.
Figure 12:
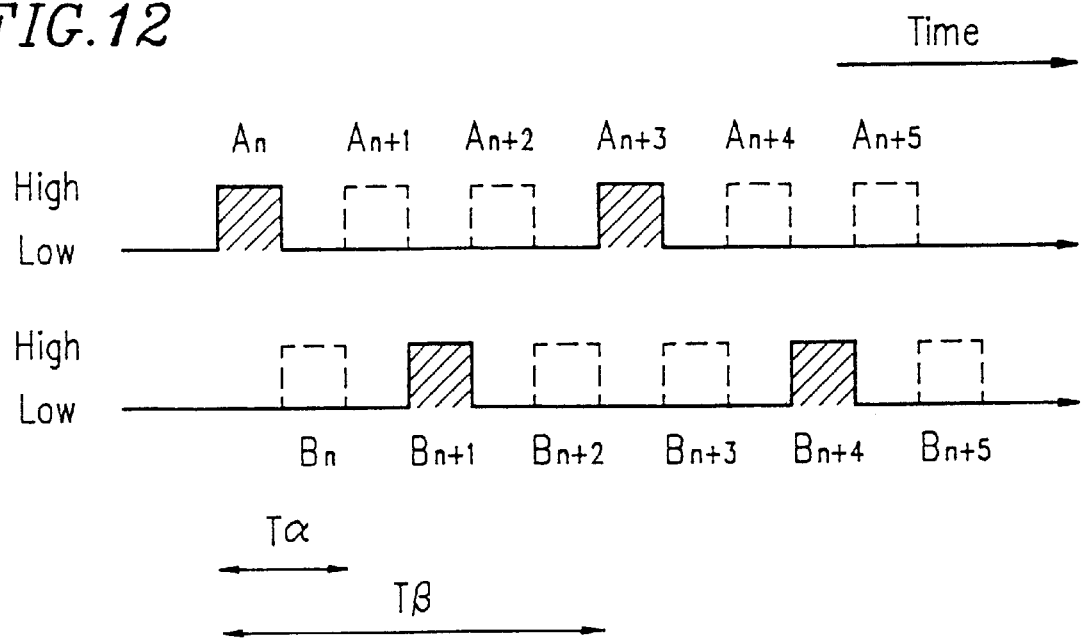
FIG. 12 is a timing diagram in helical recording in Example 4 according to the present invention.

Recording operation data indicating that the data rate at the input data stream is 4 Mbit/s is input to the operation clock selector 56. A command is input to the tape traveling controller 54 so that the tape traveling speed becomes ⅓ of that in the case of data rate of 24 Mbit/s, that is, 6 mm/s. The output signal of the operation clock selector 56 controls the recording and reproducing selector 43 so that data is recorded an the magnetic tape during only one scan out of three scans of the magnetic tape by the recording and reproducing head and data is not recorded during the remaining two scans. In stead of controlling the recording and reproducing selector 43, controlling the error correction encoder 51 can be used for the above mentioned skip recording. Assuming that the head path of the nth rotation by head A is represented by An and the head path of the nth rotation by head B is represented by Bn, data is recorded when the head paths represented by An, Bn+1, An+3, and Bn+4 trace the magnetic tape, and data is not recorded when the head paths represented by Bn, An+1, An+2, Bn+2, Bn+3, and An+4 trace the magnetic tape, as shown in FIG. 11. FIG. 12 is a timing diagram during skip recording. Here $T_\alpha$ represents a time required for the cylinder to rotate by one turn when the tape traveling speed is 6 mm/s; and $T_\beta$ represents a time required for the cylinder to rotate by three turns when the tape traveling speed is 18 mm/s. A solid line represents a period during which data is recorded, and a broken line represents a period during which data is not recorded.

In the present example, the tape traveling speed which is one over an odd number (e.g. ⅓) of the normal tape traveling speed is used, and skip recording is performed once in every certain odd number times (e.g., once in every three times). The reason for this is as follows:

In the case where the recording and reproducing head used in the present example in a 180°-opposing double heads as shown in FIGS. 8A and 8B, when the tape traveling speed which is one over an even number (e.g., ½) is used, and skip recording is performed once in every certain even number times (e.g., once in every four times), only data traced by one head path of the head A and the head B is reproduced. As a result, only recording using one kind of azimuth is realized.

Figure 13:
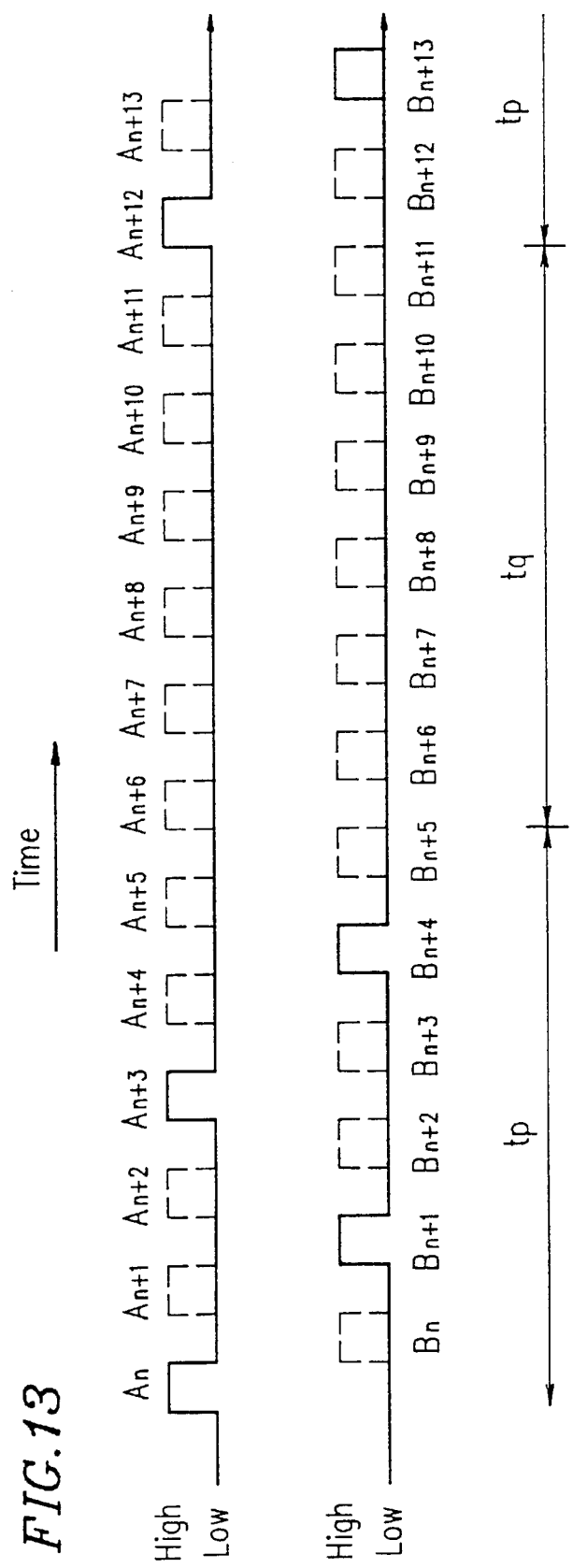
FIG. 13 is a timing diagram in helical recording under other conditions in Example 4 according to the present invention.

FIG. 13 is a timing diagram showing intermittent recording in which the traveling of the magnetic tape is stopped after skip recording. In FIG. 13, the solid line represents a period during which data is actually recorded on the magnetic tape in skip recording; and the broken line represents a period during which data is not recorded in skip recording and a period during which data is not recorded by stopping the traveling of the magnetic tape. The period tp is a period during which the magnetic tape travels, and the period tq is a period during which data is not recorded by stopping the traveling of the magnetic tape. The controls such as the skip recording for a predetermined period of time and the stop of the traveling of the magnetic tape for a predetermined period of time are performed based on the recording operation data. In the present specification, "intermittent recording" means a recording method in which two modes are alternately executed: Two modes are a recording mode in which the tape travels and data is recorded and a non-recording mode in which the tape does not travel and data is not recorded. In the present example, the periods tp and tq shown in FIG. 13 satisfy the following Equation (1):

$$tp=tq=t1 \qquad (1)$$

As in the present example, in the case where signals with a 4 Mbit/s data rate of input data stream is recorded by a recording device with a recording data rate of 24 Mbit/s, the signals are subjected to ⅙ time axis compression.

According to the above-mentioned recording method, signals with a 4 Mbit/s data rate of input data stream which is ⅙ of a normal data rate of 24 Mbit/s can be recorded. That is, as shown in the following Equation (2), such recording can be perfor—ed by combining the change in tape traveling speed, skip recording, and intermittent recording.

$$\tfrac{1}{6}=(\tfrac{1}{3})\times\{t1/(t1+t1)\} \qquad (2)$$

At this time, the value of 4 Mbit/s data rate of input data stream is recorded in an auxiliary data storage region of the magnetic tape.

Skip recording, in which the tape traveling speed is set to be 1/d of a normal data rate of input data stream, data is recorded on the magnetic tape during only one scan among d times scans, and data is not recorded during the remaining (d−1) times scans, is performed for the period of tp. Intermittent recording, in which the traveling of the magnetic tape is stopped, is performed for the period of tq. In this case, the recording data rate becomes 1/j of the normal recording data rate, as shown in the following Equation (3):

$$1/j=(1/d)\times\{tp/(tp+tq)\} \qquad (3)$$

As described above, in the case where the recording and reproducing heads are 180°-opposing double heads as shown in FIGS. 8A and 8B, d is required to be an odd number for arranging the tracks on the magnetic tape in the same manner as in the case of a normal speed shown in FIG. 10. On the other hand, in the case where the recording and reproducing heads are paired heads shown in FIGS. 9A and 9B, d is not required to be an odd number.

Hereinafter, the operation of reproducing data recorded on the magnetic tape will be described.

During reproducing data, the data is subjected to demodulation and error correction decoding, and then, reverse-converted into a format of low-rate signals by the third reproducing adaptor 60, whereby recorded signals can be obtained. When the data rate of the low-rate signals is smaller than $k_1/k_2$ of the maximum data rate of the recording and reproducing device, the third recording adaptor 53 adds data corresponding to the data rate difference. For example, the third recording adaptor 53 performs processings such as the addition of a fixed value, the addition of error correction coding, and multiple-writing by selecting important information.

Information as to whether the transmitting data rate recorded in the auxiliary data storage region of the magnetic tape is a normal data rate of 24 Mbit/s or not is obtained by the error correction decoder 59. When the transmitting data rate of recorded data is a normal data rate of 24 Mbit/s, the error correction decoder 59 corrects errors of reproduced data and outputs it.

When the recorded data rate of the input data stream is decoded to be 4 Mbit/s, a command is given to the tape traveling controller 54 based on the recording operation data obtained by the error correction decoder 59 so that the tape traveling speed becomes ⅓ of the transmitting data rate of 24 Mbit/s, i.e., 6 mm/s.

The recording and reproducing selector 43 is controlled so that data is reproduced from the magnetic tape during only one scan of the magnetic tape by the recording and reproducing head among three times scans, and data is not reproduced during the remaining two scans (i.e., skip reproducing is performed).

A command for performing idle reproducing for a period of tp=t1 and for stopping the traveling of the magnetic tape during a period of tq=t1 is given to the tape traveling controller 54 based on the recording operation data.

The recording and reproducing of the signals with a data rate of 4 Mbit/s which is ⅙ of a normal data rate of 24 Mbit/s have been described above. In this case, the data rate is made ⅙ as represented by Equation (2) by combining the change in tape traveling speed, skip recording, and intermittent recording. However, the present example is not limited thereto. For example, in order to record the signals with a data rate of 12 Mbit/s which is ½ of a normal data rate of 24 Mbit/s, data may be recorded at a normal data rate for a period of tp=t1 and the traveling of the magnetic tape is stopped for a period of tq=t1 as shown in the following Equation (4):

$$\tfrac{1}{2}=t1/(t1+t1) \qquad (4)$$

Figure 14:
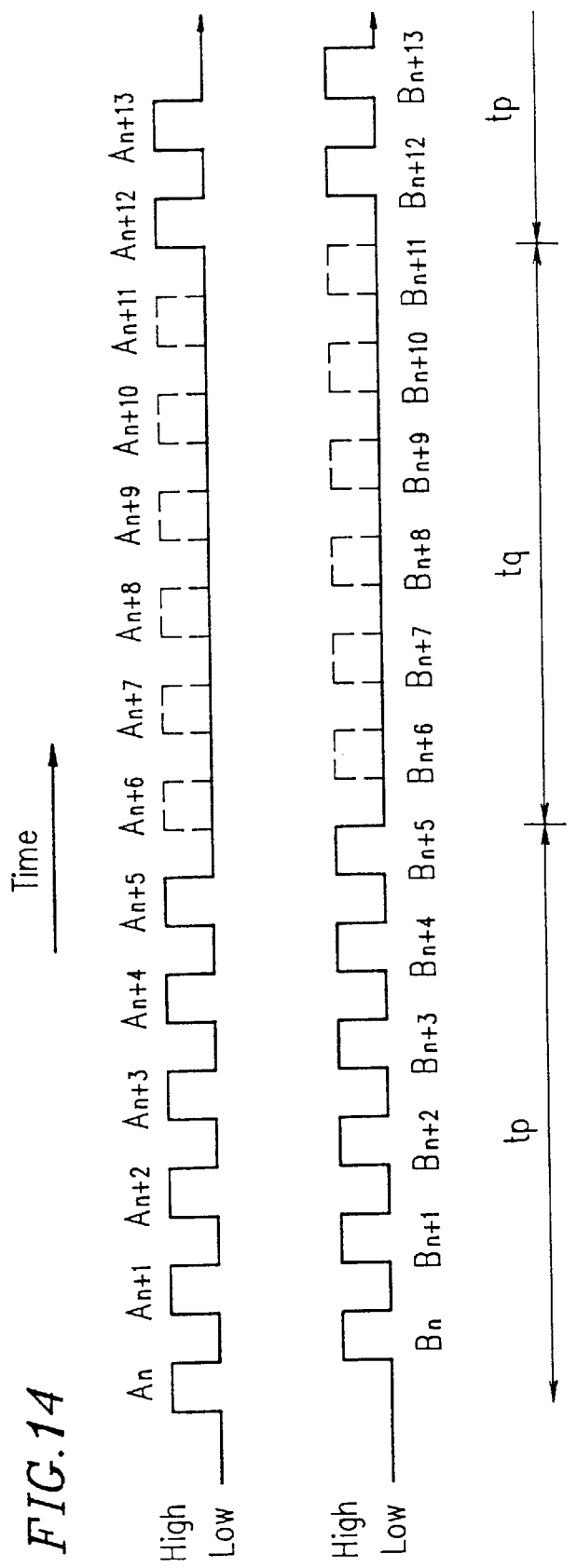
FIG. 14 is a timing diagram in helical recording under other conditions in Example 4 according to the present invention.

FIG. 14 is a timing diagram in the case where data is recorded at a data rate which is ½ of a normal data rate. In FIG. 14, the solid line in a period of tq represents a period during which data is not recorded by stopping the traveling of the magnetic tape.

Data can be recorded at a data rate which is ⅓ of a normal data rate (i.e., 8 Mbit/s) as follows:

A command is given to the recording and reproducing selector 43 so that data is recorded during only one scan among three times scans of the magnetic tape by the recording head and data is not recorded during the remaining two scans. Since data can be recorded at a data rate which is ⅓ of a normal data rate, intermittent transmission is not performed. A timing diagram for recording data at a data rate which is ⅓ of a normal data rate (i.e., 8 Mbit/s) is identical with that for skip recording in which data is recorded at a data rate which is ⅙ of a normal data rate (FIG. 12).

For recording data at a data rate which is 1/12 of a normal data rate (i.e., 2 Mbit/s), skip recording is performed for a period of tp=t1 and then the traveling of the magnetic tape is stopped for a period of tq=t1×3.

$$\tfrac{1}{12}=(\tfrac{1}{3})\times\{t1/(t1+t1\times3)\} \qquad (5)$$

In the past, one kind of recording and reproducing device has been required for signals with each kind of data rate of input data stream. In the present example, signals with a plurality of transmitting data rates can be recorded and reproduced by one kind of recording and reproducing device by combining the change in tape traveling speed, skip recording, and intermittent recording.

In the present example, a normal data rate of input data stream is set to be 24 Mbit/s, the transmitting speed of the magnetic tape is 8 mm/s, and the number of rotation of the cylinder is set to be 9000 rpm (rotation per minute). However, a normal data rate of input data stream, the transmitting speed of the magnetic tape, and the number of rotation of the cylinder can be arbitrarily set. For example, in Equation (3), if d=1 and tq=0, then j=1. This parameter setting enables the conventional recording.

Here, data of the input data stream such as 24 Mbit/s, 4 Mbit/s, etc. is recorded in the auxiliary data storage region of the magnetic tape. Recording data rate may be recorded instead of data rate of input data stream. The ratio of data rate of input data stream to a normal recording data rate (e.g., ⅙ in the case where the normal data rate of input data stream is 24 Mbit/s and the data rate of input data stream is 4 Mbit/s) may be recorded. A signal indicating whether video signals are transmitted at a normal data rate of input data stream or at the other data rates may be recorded. The data rate of input data stream may be recorded in an auxiliary data storage region of the magnetic tape or may be recorded in an auxiliary storage medium such as a memory provided in a cassette accommodating the magnetic tape. The auxiliary data storage region refers to a region other than those of the magnetic tape in which video data and audio data are recorded.

In the second, thirds and fourth examples, the recording devices, in which video signals are recorded at two kinds of data rates, i.e., a normal data rate and a data rate lower than the normal data rate, are described.

In the rotary cylinder driving control device 55 shown in FIG. 6, two operations can be performed: a method for rotating the cylinder at the same speed as that used for recording at a normal data rate (method A) and a method for decreasing the rotation speed of the cylinder in accordance with the decrease in data rate (method B). According to the method A, since the magnetic head scans the magnetic tape at three times the number of tracks required for recording data, data is actually recorded during only one scan among three scans. Assuming that the effective number of scans is an average value of the number of heads actually used for recording while the cylinder rotates by one turn, in the method A, the number of scans becomes ⅓ of the number of scans at the time when data is recorded at a normal data rate. In both of the methods A and B, the tape speed is ⅓ of that at a normal rate.

FIG. 15 shows a track pattern on the magnetic tape according to the methods A and B. The track pattern according to the method B is represented by a track 152, which is the identical pattern with that of the standard tracks. The track pattern according to the method A is represented by track 154. As shown in FIG. 15, the cylinder rotation speeds are different depending upon the two methods, the respective track angles are different from each other. Since it is difficult for ordinary reproducing devices to deal with two kinds of track angles, the recording format is limited to either one of the track angles (i.e., method A or method B).

According to the method A, even though data is recorded at a low data rate of 8 Mbit/s, the cylinder rotation speed is the same as that for recording at a normal data rate. Because of this, the power consumption and signal processing speed are the same as those for recording at a normal data rate. On the other hand, according to the method B, the ratio of the cylinder rotation speed to the recording data rate during recording at a normal data rate becomes three times the ratio of the cylinder rotation speed to the recording data rate during recording at a low data rate. For this reason, the device having a circuit and head for a normal rate cannot be compatible with the device having a circuit and head for ⅓ rate of the normal rate.

EXAMPLE 5

As described above, the limitation of the angle of the tracks leads to the great limitation of devices to be actually used. For this reason, it the present example, a data format of recording medium which permits a plurality of track angles can be used. For example, difference between an center line of the standard track 152 and an center line of the track 154 is on the order of 3 μm at an edge of the tape, whereas the track pitch is on the order of 10 μm. Compared to the track pitch, the displacement between the standard track 152 and the track 154 is relatively small to such an extent that the two tracks overlap. Therefore, a data format of magnetic tape for a plurality of tracks can be designed for flexible recording and reproducing.

As another example, a wide pitch head can be used for the plurality of the tracks on the magnetic tape. The wide pitch head can trace both the standard track 152 and the track 154 because the width of the head exceeds the track pitch.

According to the present example, both of the above-mentioned methods A and B can be selected.

EXAMPLE 6

A reproducing device reproducing data recorded in a recording format enabling a plurality of track angles will be described.

As is apparent from the track pattern of FIG. 15, in the case where the angle of the recorded track is different from the angle of a head scanning at a time of reproducing data on the recorded track, it is difficult to reproduce the correct recorded data. In the present example, in order to reproduce signals from the tracks having various track angles, the cylinder rotation speed which is higher than usual is used. According to this method, it is difficult to reproduce all of the data recorded in one track by only one head scan. However, since the number of head scans is increased, all of the data recorded in one track can be reproduced by scanning one track a plurality of times. Thus, according to the present example, data can be reproduced from tracks with any track angles. Because of this, even in the case where the cylinder rotation speed is not limited at the time of recording data as described in Example 5, correct data can be reproduced. The effects obtained by increasing the cylinder rotation speed can also be obtained by increasing the number of heads mounted on the cylinder.

FIG. 16 is a block diagram of a reproducing device of Example 6 according to the present invention. In FIG. 16, the reference numeral 161 denotes a magnetic tape, 162 denotes an error correction shuffling device, 163 denotes a memory, 164 denotes a high efficiency decoder, and 165 denotes an output portion.

Signals reproduced from the magnetic tape 161 are input to the error correction shuffling device 162. The error correction shuffling device 162 corrects a part or all of the error correction code and transfers decoded data to the memory 163. The data stored in the memory 163 is read by the error correction shuffling device 162 so as to be shuffled in the order suitable for the processing in the high efficiency decoder 164. If required, the data thus read is subjected to error correction by the error correction shuffling device 162 and is input to the high efficiency decoder 164. The high efficiency decoder 164 decodes the input data, converted it into video data, audio data, etc. and outputs the converted data to the output portion 165.

As described above, according to the present example, the reproduced data can be shuffled when it is read from the memory 163 by controlling an address of the data or a timing of retrieving the data. In general, the data reproduced from the magnetic tape 161 includes address data. The address data indicates which portion of the tracks the reproduced data has been recorded in. In the case where data is reproduced in the order different from the usual order due to the off-tracking, the data from the memory 163 is shuffled in the correct order based on the address data. Such shuffling can be utilized for high-speed reproduction, slow reproduction functions of DVCRS.

EXAMPLE 7

A reproducing device of Example 7 according to the present invention will be described. In the present example, data can be reproduced by at least two kinds of data rates, i.e., a normal data rate and a data rate lower than the normal one. Here, it is assumed that the normal data rate is 24 Mbit/s and the low data rate is 8 Mbit/s.

In the case where the data rate is 8 Mbit/s, the tape traveling speed and the number of tracks reproduced per unit period become ⅓ of those at the time when data is reproduced at the normal data rate (i.e., 24 Mbit/s). As described in Example 4, there are two methods for recording such low-rate signals. The track angles are different between these methods. For this reason, as described in Example 5, data recorded by both of these methods cannot be reproduced by a normal reproducing method. In the present example, in the case where the low-rate signals are reproduced, the tape traveling speed is made ⅓ of that at a time when data is reproduced at the normal data rate, and the rotation number of the cylinder and the number of the effective heads are made the same as those at the time when data is reproduced at the normal data rate.

As a result, even though each reproducing head cannot exactly trace the tracks, the number of the effective heads becomes three times that required for reproducing data; therefore, sufficient amount of data can be reproduced.

FIG. 17 is a block diagram of a reproducing device of Example 7 according to the present invention. In FIG. 17, the reference numeral 171 denotes a magnetic tape, 172 denotes an error correction shuffling device, 173 denotes a memory, 174 denotes a high efficiency decoder, 175 denotes an output portion, 176 denotes a tape traveling controller, and 177 denotes a data rate input portion. A data rate to he reproduced is input to the data rate input portion 177. The data rate is then input to the tape traveling controller 176. In the case where the data rate is a normal data rate (i.e., 24 Mbit/s), the magnetic tape 171 travels at a normal tape traveling speed; and in the case where the data rate is a low data rate (i.e., 8 Mbit/s), the magnetic tape travels at a tape traveling speed which is ⅓ of the normal one. In the present example, the rotation number of the cylinder and the number of the effective heads at the time when data is reproduced at the low data rate are the same as those at the time when data is reproduced at the normal data rate.

The signals reproduced from the magnetic tape 171 are input to the error-correction shuffling device 172. The error correction shuffling device 172 corrects a part or all of the error correction code and transfers the decoded data to the memory 173. The data stored in the memory 173 is read by the error correction shuffling device 172 so as to be shuffled in the order suitable for the processing in the high efficiency decoder 174. If required, the data thus read is subjected to the error correction by the error correction shuffling device 172 and is input to the high efficiency decoder 174. The high efficiency decoder 174 decodes the Input data, converted it into video data, audio data, etc. and outputs the converted data to the output portion 175.

As described above, according to the present example, the reproduced data from the memory 173 can be shuffled. In the case where data is reproduced in the order different from the usual order due to the off-tracking, the data from the memory 173 is shuffled in the correct order based on the address data. Such a method for reproducing low-rate signals is similar to a method by which normal-rate signals are reproduced at a slow rate (i.e., ⅓ times).

As described above, in the reproducing device of Example 7, stable reproduction of data can be made possible irrespective of the track angles by reproducing the low-rate signals and the normal-rata signals in almost the same reproducing method.

EXAMPLE 8

FIG. 18 is a block diagram of a recording device of Example 8 according to the present invention. In FIG. 18, the reference numeral 181 denotes an input portion for video signals or audio signals, 182 denotes a time axis compressor, 183 denotes a high efficiency encoder, 184 denotes an error correction encoder, 185 denotes a magnetic tape, and 186 denotes a data rate input portion. Video signals or audio signals are input from the input portion 181 to the time axis compressor 182. In the case where a value, which indicates that the input video signals or the audio signals are those to be reproduced at a normal data rate, is input, the input data (i.e., the video signals or the audio signals) is output to the high efficiency encoder 183 instead of being subjected to time axis compression by the time axis compressor 182. In the case where a value, which indicates that the input video signals or the audio signals are those to be reproduced at a data rate lower than the normal one, is input, the input data (i.e., the video signals or the audio signals) is subjected to time axis compression by the time axis compressor 182 and is output to the high efficiency encoder 183. For example, the low-rate signals represented by the solid line of FIG. 12 are subjected to time axis compression to be converted into the normal-rate signals as represented by the dotted line. Here, time axis compression refers to the conversion of signals having a low data rate into signals having a large amount of data rate by utilizing a memory device or a hard disk device, etc.

As described above, during reproducing, the data rate of the low-rate signals is increased by the time axis compression before high efficiency coding. By doing so, the data rate after the high efficiency coding is made almost the same as the normal data rate. More specifically, the high efficiency encoder 183 decreases the compression ratio of the normal-rate signals and increases the compression ratio of the low-rate signals. The data after the high efficiency coding is subjected to the error correction coding by the error correction encoder 184 and is recorded on the magnetic tape 185.

As described above, in the present example, since the normal-rate signals and the low-rate signals can be recorded at almost the same data rate after the high efficiency coding, a recording processing circuit is simplified. In the construction shown in FIG. 18, signals are input and then are subjected to time axis compression. It is also possible that data which has been subjected to time axis compression is input. Furthermore, data which is subjected to time axis compression after high efficiency coding can be directly input to the error correction encoder 184.

In the case where the low-rate signals are recorded according to the present example, the angle of the tracks on the magnetic tape becomes different from that in the case where the same data is recorded without time axis compression. However, if the reproducing device of Example 6 or 7 is applied, the angle of the tracks in both cases can be reproduced by the same reproducing device.

Furthermore, the control during reproducing data can be made correct by recording, on the magnetic tape, data indicating the difference in angle of the tracks depending upon the recording methods, the tape traveling speed during recording, the time axis compression ratio, the data rate, etc.

EXAMPLE 9

FIG. 19 shows a recording device of Example 9 according to the present invention. In FIG. 19, the reference numeral 191 denotes an input portion for video signals or audio signals, 192 denotes a high efficiency encoder, 193 denotes an error correction encoder, 194 denotes a magnetic tape, 195 denotes a data rate input portion, and 196 denotes a tape traveling controller. Video signals or audio signals input from the input portion 191 are subjected to high efficiency coding by the high efficiency encoder 192 based on the data rate for recording or reproducing input from the data rate input portion 195, and are encoded by the error correction encoder 193 to be recorded on the magnetic tape 194.

The number of tracks in which low-rave signals are recorded in a predetermined period of time is smaller than that for recording normal-rate signals. In general, the tape traveling speed is varied in proportion with the number of tracks in which data is recorded in a predetermined time of period. In the present example, the tape traveling speed is set to be lower by the tape traveling controller 196 in the case of the low-rate signals. Because of this, when the low-rate signals are recorded, the track pitch becomes smaller than that for recording the normal-rate signals. As a result, the amount of tape to be consumed can be decreased.

In the case where data is recorded with a track pitch smaller than usual in accordance with the present example, the angle of the tracks on the magnetic tape becomes different from that in the case where data is recorded with a normal track pitch. However, if the reproducing device of Example 6 or 7 is applied, data can be reproduced by the same reproducing device in both cases.

Control during reproducing data can be made correct by recording data indicating the difference in width of the tracks depending upon the recording methods, the tape traveling speed during recording, the time axis compression ratio, the data rate, etc.

EXAMPLE 10

FIG. 20 shows a recording and reproducing device of Example 10 according to the present invention. In FIG. 20, the reference numeral 201 denotes a magnetic tape, 202 denotes an error correction deshuffling device, 203 denotes a transmission path, 204 denotes an error correction encoder, and 205 denotes a magnetic tape.

The left side of the transmission path 203 corresponds to a reproducing device, and the right side of the transmission path 203 corresponds to a recording device. Data reproduced from the magnetic tape 201 by the reproducing device is subjected to error correction and the like by the error correction deshuffling device 202. The error-corrected data is input to the error correction encoder 204 of the recording device through the transmission path 203. The data is subjected to error correction coding by the error correction encoder 204 and is recorded on the magnetic tape 205.

In the present example, low-rate signals to be reproduced by the reproducing device at a data rate lower than the normal data rate are also reproduced at a data rate equivalent to the normal data rate (normal tape traveling speed) and is output to the recording device. In the recording device, both of the normal-rate signals and the low-rate signals are recorded on the magnetic tape 205 at the identical data rate (tape traveling speed).

Thus, the low-rate signals can also be copied at a data rate equivalent to the normal data rate. For example, in the case where the data rate of the normal-rate signals is 24 Mbit/s and the data rate of the low-rate signals is 8 Mbit/s, the low-rate signals can be copied three times faster than that in the case where they are copied at a low data rate. Such high-speed copying enables a great reduction of the manufacturing period of pre-recorded soft tapes and manufacturing cost thereof. In addition, data recorded in this way can be reproduced by the reproducing device of Example 6 or 7.

It is noted that the normal data rate and the low data rate described in Examples 4 to 10 can be set to be a plurality of values, respectively in one device.

As is apparent from the above description, in the reproducing device according to the present invention, much more data than that reproduced by a normal method can be reproduced. Consequently, even in the case where the recording tracks have different angles, all of the data in the tracks can be reproduced. Since the limitation of the recording method (especially, the track angles) can be alleviated by using the reproducing device of the present invention, the reproducing device of the present invention can be applied to various kinds of recording methods.

Regarding the low-rate signals, data more than that required for reproducing the low-rate signals can be reproduced, and even in the case where the recording track angles are different, all of the data in the tracks can be reproduced. Thus, by using the reproducing device of the present invention, the limitation of the recording method with respect to the low-rate signals can be alleviated. Furthermore, the reproduction of the low-rate signals can be performed by the same processing as slow reproduction of the normal-rate signals.

According to the recording device of the present invention, the low-rate signals are subjected to time axis compression to be recorded at a normal data rate in a short period of time, and hence prerecorded soft tapes and the like can be produced in a short period of time without using a special recording device. In addition, data can be recorded with a track pitch smaller than usual, reducing the consumption amount of a pre-recorded soft tape and the like. Furthermore, data can be reproduced at a data rate higher than usual and the reproduced data can be recorded at the higher data rate, enabling high-speed copying.

EXAMPLE 11

A recording device of Example 11 and the relationship between the track pitch and the tape traveling speed will be described with reference to FIGS. 21 and 22, respectively. In FIG. 21, the reference numeral 211 denotes a head, 212 denotes a rotary cylinder, and 213 denotes a tape. In FIG. 22, the reference numeral 152 denotes a standard track, 221 denotes a head moving vector, 222 denotes a tape traveling vector, 150 denotes a conventional predetermined head moving vector, and 151 denotes a conventional predetermined tape traveling vector.

The rotary cylinder 212 provided with the head 211 rotates to form tracks on the tape 213, whereby data is recorded. The rotation axis tilt angle relative to the center line of the tape 213 is set so that the direction of the head roving vector 221 (i.e., the direction in which the head 211 moves) becomes a desired direction associated with the rotation of the rotary cylinder 212 having the rotation axis.

The tape traveling speed is determined by the data rate of signals to be recorded. The tape traveling vector 222 is determined based on the distance which the tape travels for the time period required for forming one track. The direction of the tape traveling vector 222 is in parallel with the longitudinal direction of the tape. Since the standard track 150 has already been determined, the desired direction of the head moving vector 221 is determined based on the tape traveling vector 222 so as to form the standard track 150.

According to the above-mentioned construction, the standard track 152 having a predetermined track angle can be formed and data having a data rate other than the normal one can be recorded.

FIG. 23 is a block diagram of a recording device of the second construction example of Example 11 according to the present invention. The reference numeral 231 denotes a receiving signal input portion, 232 denotes a data recording circuit, 233 denotes a rotary cylinder, 234a and 234b denote recording heads, 235 denotes a tape, 236 denotes a switch, and 237 denotes a tape traveling control circuit. Here, a 180°-opposing double heads is used, and the tape 235 is wrapped around the rotary cylinder 233 by 180°. The recording heads 234a and 234b have respectively different azimuth angles.

In the recording device, data having a data rate other than the normal one is input to the receiving signal input portion 231. The data recording circuit 232 performs recording signal processings such as error correction coding, modulation and demodulation, and data shuffling to generate recording signals, and output the recording signals in accordance with the recording timing. The recording signals are recorded on the tape 235 by the recording heads 234a and 234b provided in the rotary cylinder 233. As described in Example 1, the angle formed by the rotation axis of the rotary cylinder 233 and the center line of the tape 235 is set to be a desired value determined the data rate of input data. The switch 236 connects the recording head which is recording data to the data recording circuit 232. When the data rate other than the normal one is k1/k2 or less (k1 and k2 are integers) of the normal data rate, the tape traveling control circuit 237 makes the tape traveling speed k1/k2 times the normal speed. At the same time, the tape traveling control circuit 237 controls the rotation tilt angle of the rotary cylinder 212 in accordance with the tape traveling speed.

Figure 24:
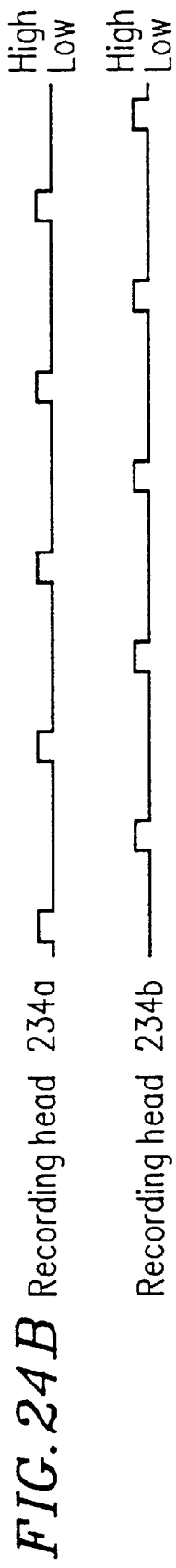

FIGS. 24A to 24D are timing diagrams in which the period for actually recording data by each recording head is represented by "High" and the period for recording no data by each recording head is represented by "Low". FIG. 24A is a timing diagram in which data is recorded at a normal data rate. FIG. 24B is a timing diagram in which k1 is 1 and k2 is 3; FIG. 24C is a timing diagram in which k1 is 1 and k2 is 5; and FIG. 24D is a timing diagram in which k1 is 1 and k2 is 7. When signals having such a normal data rate are recorded, the tape traveling speed should be known at the time of reproducing data. For the purpose of knowing the tape traveling speed, the tape traveling speed data may be input to the reproducing device from outside every time data is reproduced. Correct tape traveling speed data can be always obtained by recording data indicating the tape traveling speed in the part of the recording signals by the data recording circuit 32.

According to the above-mentioned construction, even in the case where data having a data rate other than the normal one is input, tracks in accordance with the standard can be formed. In particular, when the data rate is low, long-time recording is made possible and dubbing recording is made possible in a short period of time by allowing a tape which is subjected to long-time recording to travel at a normal speed.

FIG. 25 is a block diagram of a recording device of the third construction example of Example 11 according to the-present invention. The reference numeral 231 denotes a receiving signal input portion, 232 denotes a data recording circuit, 233 denotes a rotary cylinder, 234a and 234b denote recording heads, 235 denotes a tape, 236 denotes a switch, 237 denotes a tape traveling control circuit, and 238 denotes a data rate detecting circuit. The receiving signal input portion 231, the data recording circuit 232, the rotary cylinder 233, the recording head 234a and 234b, the tape 235, the switch 236, and the tape traveling control circuit 237 function in the same way as in the second construction example. The data rate of input data is detected by the data rate detecting circuit 238. Tape traveling speed is determined based on the detected data rate. Then, in accordance with the determined data, the data recording circuit 232 and the tape traveling control circuit 237 are controlled.

According to the above-mentioned construction, data having a plurality of data rates (which may contain a normal data rate) other than a normal one can be recorded.

The block construction of the recording device of the present example is merely an example. The same effects can be obtained with any constructions. In the present example, a double-azimuth 180°-opposing double heads is used, and the tape is wrapped around the cylinder by 180°. In this construction, k1 is 1, and k2 is limited to an odd number. When paired heads, i.e., a combination of a head A and a head B mounted adjacent to each other is used, k2 can be an arbitrary number. In the case where two paired double-azimuth 180°-opposing double heads are used and the tape winds around the cylinder by 180°, k1 can be made 2. Alternatively, in the case where data is recorded with a guard band instead of any azimuth, k1 and k2 can be any numbers even in any constructions of heads.

In the present example, the tilt angle of the rotation axis of the rotary cylinder is varied. In the case where a recording head utilizing, for example, a piezoelectric element is used, tracks in accordance with standards can be formed by moving the recording head in parallel with the rotation axis of the rotary cylinder while recording tracks with the same mechanism of the rotary cylinder.

In the case where the data rate of input data is smaller than k1/k2 of a normal data rate of the recording device, the data recording circuit 232 can add data corresponding to the difference between the data rate of the input data and k1/k2 of the normal data rate. For example, the data recording circuit 232 can perform processings such as the addition of a fixed value, the addition of error correction coding, and multiple-writing by selecting important information.

In the second and third construction examples, the recording heads 234a and 234b are used. It is also possible to use heads for recording and reproducing data.

In the present example, the tape traveling speed data is recorded on the tape. In the case where an auxiliary storage medium (e.g., a memory, a magnetic tape) is provided in a cassette accommodating the tape, such data can be stored in the auxiliary storage medium. By doing so, correct tape traveling speed data can be obtained before starting the operation of reproducing.

As described above, in the recording device of the present example, since the track angle of the tracks to be recorded can be maintained at the same angle even though the tape travels at any speed, data having a data rate other than a normal one can be appropriately recorded. Thus, the effects for practical use are great.

Furthermore, in the case of the low-rate data, long-time recording and fast dubbing recording by allowing the tape to travel at a normal speed are made possible.

The recording and reproducing devices in above-mentioned examples may be devices designed specifically for recording or reproducing data, or may be recording/reproducing-device in which a recording portion and a reproducing portion cannot be simultaneously operated. Even in this case, the same effects as those in the above examples can be obtained.

In the above-mentioned examples 1 through 11, setting the recording data rate to be proportional to the traveling speed of the magnetic tape allows using the conventional recording format. Also, the recording device can record auxiliary digital data on the recording medium with digital data for audio and video signals. The auxiliary digital data includes: a track angle; a track pitch; a traveling speed of the recording medium; a rotation number of the rotary cylinder. The auxiliary digital data can be stored in an storage medium provided in a cassette accommodating the recording medium.

Furthermore, the examples are described taking a VCR as an example; however, the sane recording method can be applied to devices other than VCRs. These examples can be combined.

Various constructions other than those of the above-mentioned examples can be applied to the present invention. For example, the above-mentioned hardware construction can be realized by using software having the identical function with that of the hardware.

According to the present invention, it is not necessary to limit the kinds of data to be recorded. On the other hand, in the case where the device of the present invention tries to reproduce data which is recorded on the magnetic tape in a format which the device cannot reproduce, the device performs an abnormal termination processing.

As described above, the recording and/or reproducing device of the present invention can deal with various video signals with a simplified construction. Furthermore, according to the present invention, the limitation during recording data is greatly alleviated, so that the recording device can be made simplified and varied. Thus, the practical effects of the present invention are great.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A digital data recording device comprising:

a rotary cylinder, a head mounted on the rotary cylinder, for recording digital data on a recording medium, a data adder for detecting a data rate of an input data stream, generating additional data corresponding to a difference between the data rate of the input data stream and a data rate of an output data stream, and adding the additional data to the input data stream, and recording means for recording the output data stream having a predetermined data rate on the recording medium based on a recording format capable of selecting a plurality of track angles determined in accordance with a speed vector of the head and a speed vector of the recording medium, wherein the recording means records digital data indicating at least one of the group consisting of a track angle during recording, a traveling speed of the recording medium, a rotation number of the rotary cylinder, and a track pitch of the recording medium.

2. A digital data recording device according to claim 1, comprising first recording control means for controlling traveling of the recording medium so that the data stream is recorded on the recording medium once in every m times scans along tracks on the recording medium by the head when the data stream has a data rate which is 1/m (m is a natural number) of a predetermined data rate.

3. A digital data recording device according to claim 2, comprising second recording control means for controlling beginning and stopping of traveling of the recording medium synchronous with rotation of the rotary cylinder and for controlling recording the digital data on the recording medium synchronous with rotation of the rotary cylinder.

4. A digital data recording device according to claim 1, comprising recording control means for controlling beginning and stopping of traveling of the recording medium synchronous with rotation of the rotary cylinder and for controlling recording the digital data on the recording medium synchronous with rotation of the rotary cylinder.

* * * * *